US012666637B2

(12) United States Patent
Lin et al.

(10) Patent No.: US 12,666,637 B2
(45) Date of Patent: Jun. 23, 2026

(54) METHOD OF FORMING A CONTACT PLUG USING AN HOURGLASS-SHAPED OPENING TO PREVENT A BOWING PROFILE

(71) Applicant: Taiwan Semiconductor Manufacturing Co., Ltd., Hsinchu (TW)

(72) Inventors: Chun-Neng Lin, Hsinchu (TW); Yu-Shih Wang, Tainan (TW); Chia-Ling Chung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 551 days.

(21) Appl. No.: 18/191,067

(22) Filed: Mar. 28, 2023

(65) Prior Publication Data

US 2024/0332354 A1 Oct. 3, 2024

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/01* | (2025.01) |

(52) U.S. Cl.
CPC ........... *H10D 30/43* (2025.01); *H10D 30/014* (2025.01); *H10D 30/6735* (2025.01); *H10D 30/6757* (2025.01); *H10D 62/121* (2025.01); *H10D 64/017* (2025.01)

(58) Field of Classification Search
CPC ............. H10D 84/0158; H10D 62/121; H10D 62/151; H10D 64/017; H10D 30/6735; H10D 84/0149
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |

(Continued)

FOREIGN PATENT DOCUMENTS

| | | |
|---|---|---|
| TW | 200818500 A | 4/2008 |
| TW | 201839813 A | 11/2018 |

(Continued)

*Primary Examiner* — Davienne N Monbleau
*Assistant Examiner* — Dmitri Mihaliov
(74) *Attorney, Agent, or Firm* — Slater Matsil, LLP

(57) ABSTRACT

A method of forming a semiconductor device includes: forming an opening in a dielectric layer to expose an underlying conductive feature; conformally forming a first protection layer and a second protection layer in the opening; performing an anisotropic etching to remove a first portion of the second protection layer from the bottom of the opening while keeping a second portion of the second protection layer along the sidewalls of the opening; after the anisotropic etching, performing an isotropic etching to remove, from the sidewalls of the opening, an upper portion and a lower portion of the first protection layer while keeping a middle portion of the first protection layer along the sidewalls of the opening; after the isotropic etching, performing an anneal to at least partially convert the second portion of the second protection layer into an oxide; and after the anneal, filling the opening with a conductive material.

20 Claims, 18 Drawing Sheets

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,037,923 B1 | 7/2018 | Lee et al. | |
| 10,177,038 B1 * | 1/2019 | Lee | H10D 84/0149 |
| 2008/0001236 A1 | 1/2008 | Change | |
| 2019/0157386 A1 | 5/2019 | Ando et al. | |
| 2019/0385896 A1 * | 12/2019 | Chiang | H01L 21/7682 |
| 2022/0359066 A1 | 11/2022 | Chu et al. | |
| 2022/0406647 A1 * | 12/2022 | Chou | H01L 21/7682 |
| 2023/0060825 A1 | 3/2023 | Kao et al. | |

FOREIGN PATENT DOCUMENTS

| | | | |
|---|---|---|---|
| TW | 202145361 A | 12/2021 | |
| TW | 202310409 A | 3/2023 | |

* cited by examiner

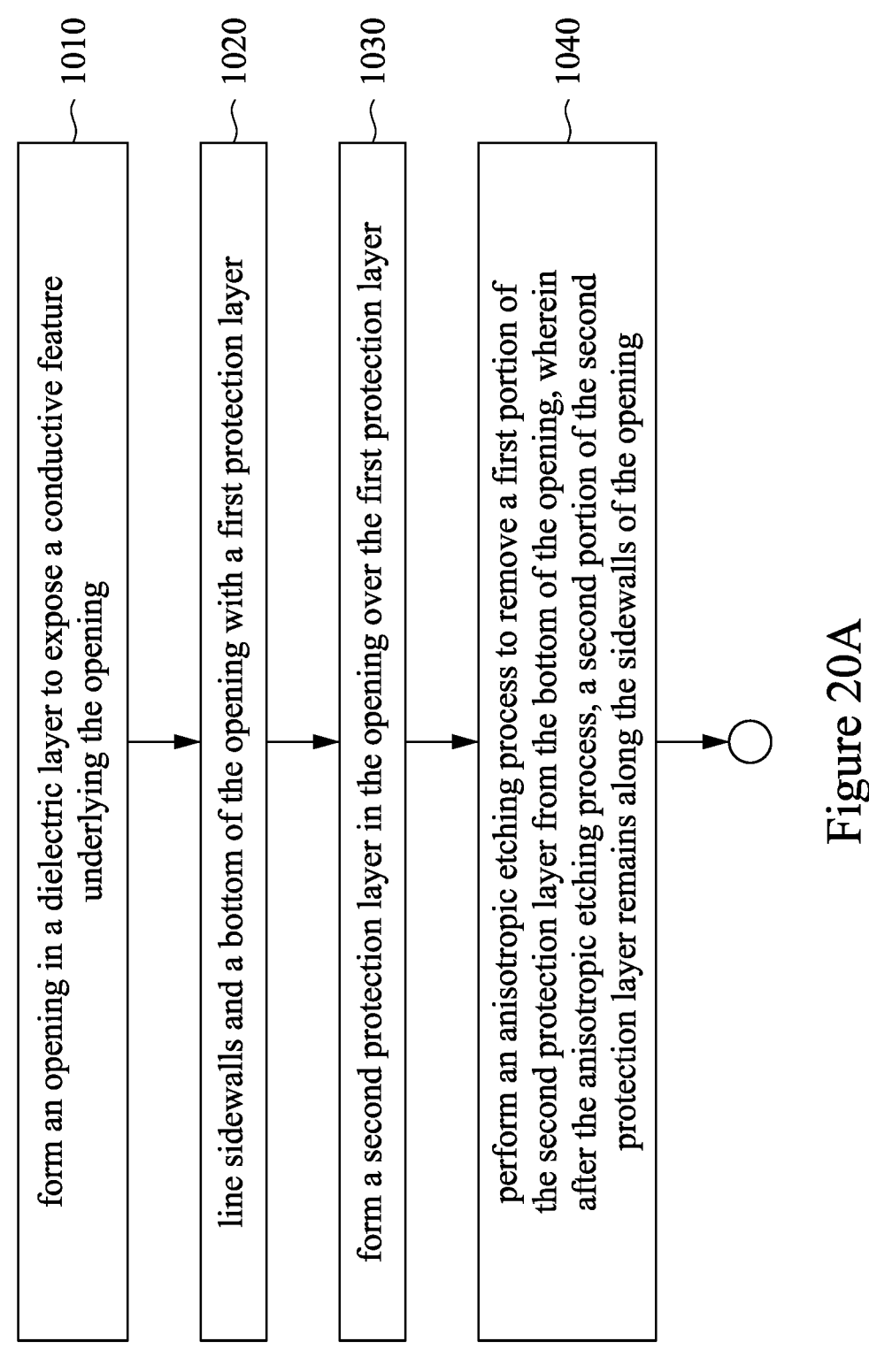

1000

1010 — form an opening in a dielectric layer to expose a conductive feature underlying the opening 1020 — line sidewalls and a bottom of the opening with a first protection layer 1030 — form a second protection layer in the opening over the first protection layer 1040 — perform an anisotropic etching process to remove a first portion of the second protection layer from the bottom of the opening, wherein after the anisotropic etching process, a second portion of the second protection layer remains along the sidewalls of the opening

Figure 20A

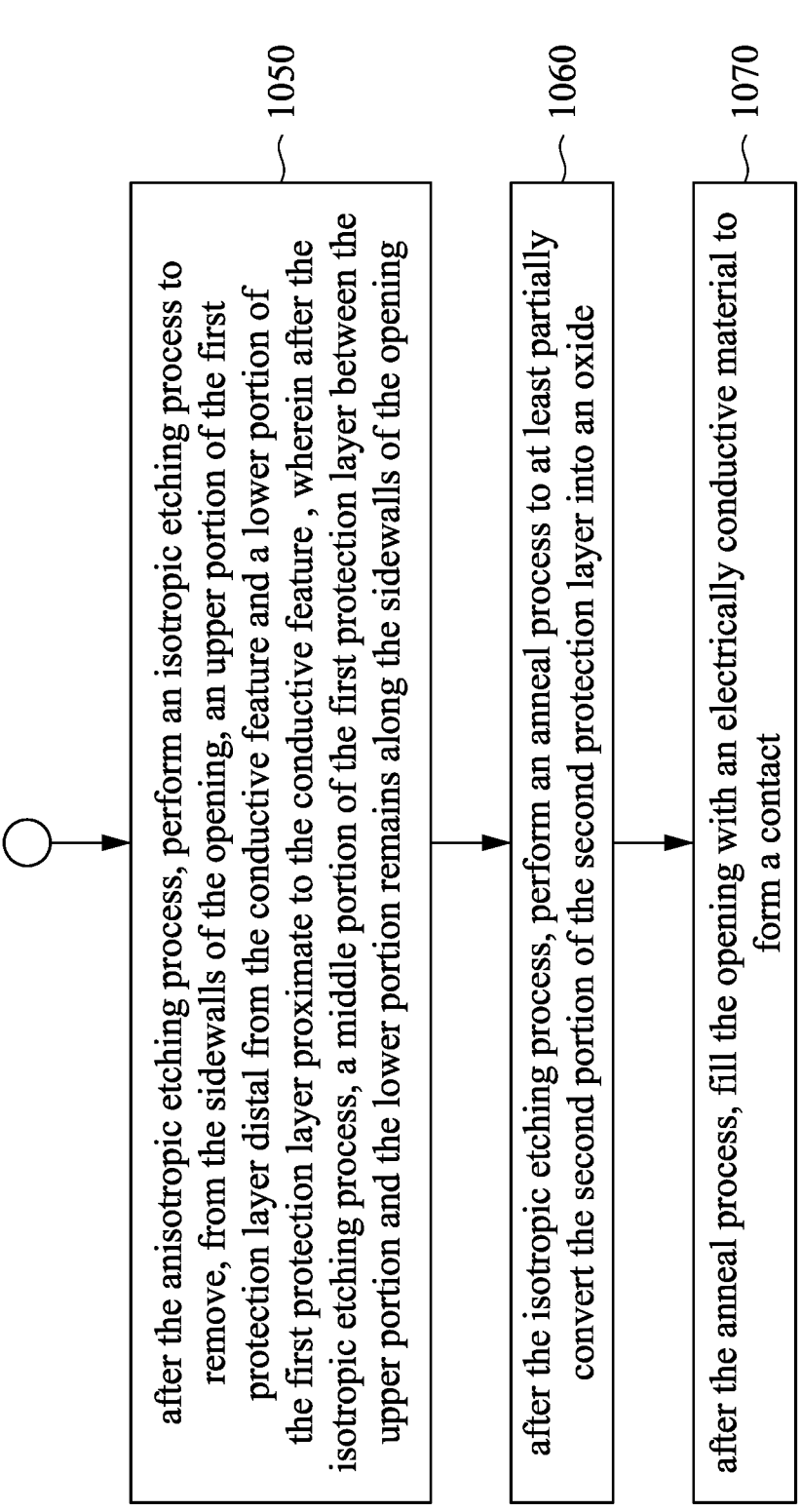

after the anisotropic etching process, perform an isotropic etching process to remove, from the sidewalls of the opening, an upper portion of the first protection layer distal from the conductive feature and a lower portion of the first protection layer proximate to the conductive feature , wherein after the isotropic etching process, a middle portion of the first protection layer between the upper portion and the lower portion remains along the sidewalls of the opening ⟩ 1050 after the isotropic etching process, perform an anneal process to at least partially convert the second portion of the second protection layer into an oxide ⟩ 1060 after the anneal process, fill the opening with an electrically conductive material to form a contact ⟩ 1070

Figure 20B

METHOD OF FORMING A CONTACT PLUG USING AN HOURGLASS-SHAPED OPENING TO PREVENT A BOWING PROFILE

BACKGROUND

Semiconductor devices are used in a variety of electronic applications, such as, for example, personal computers, cell phones, digital cameras, and other electronic equipment. Semiconductor devices are typically fabricated by depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figures 5A, 5B, 5C:
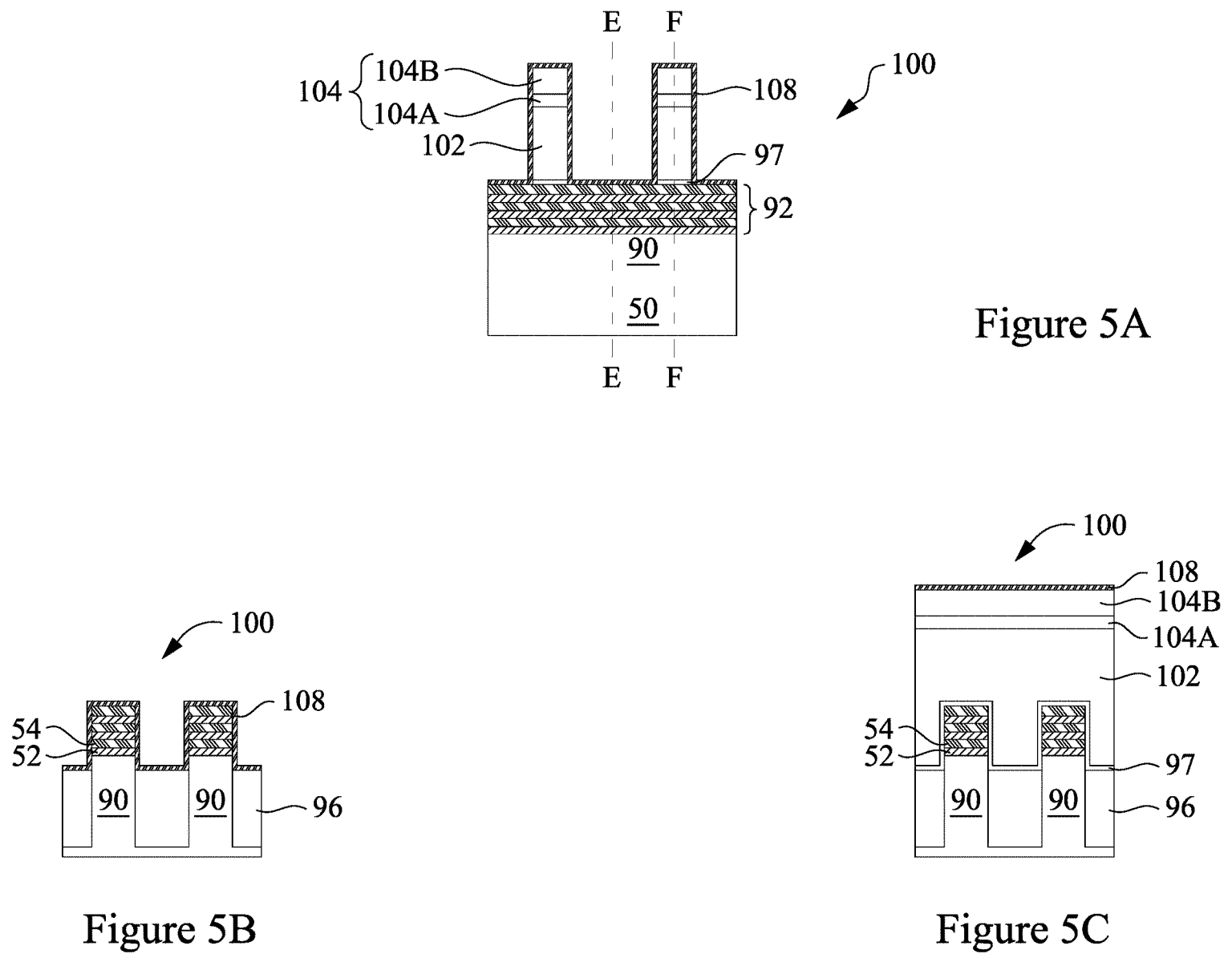
Figures 6A, 6B, 6C:
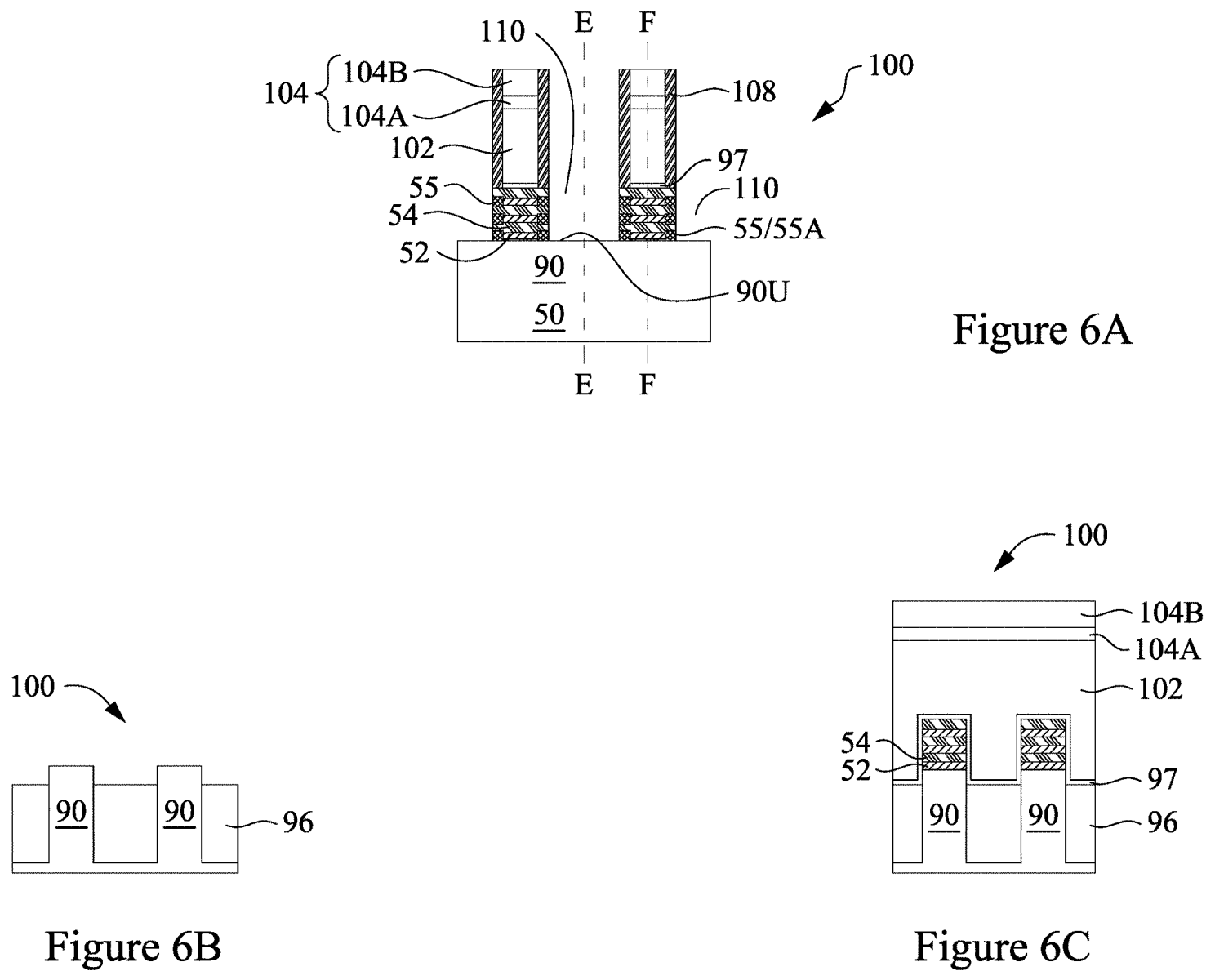

FIGS. 2, 3A, 3B, 4A, 4B, 5A-5C, 6A-6C. 7A-7C, 8A, 8B, 9A, 9B, 10A, 10B, 11A, 11B, 12A, 12B, 13A, 13B, 14A, 14B, 15A, 15B, 16A, 16B, 17A, 17B, 18A-18D, and 19A-19D are cross-sectional views of a nanostructure field-effect transistor device at various stages of manufacturing, in accordance with an embodiment.

FIGS. 20A and 20B together illustrate a flow chart of a method of forming a semiconductor device, in some embodiments.

DETAILED DESCRIPTION

Figure 1:
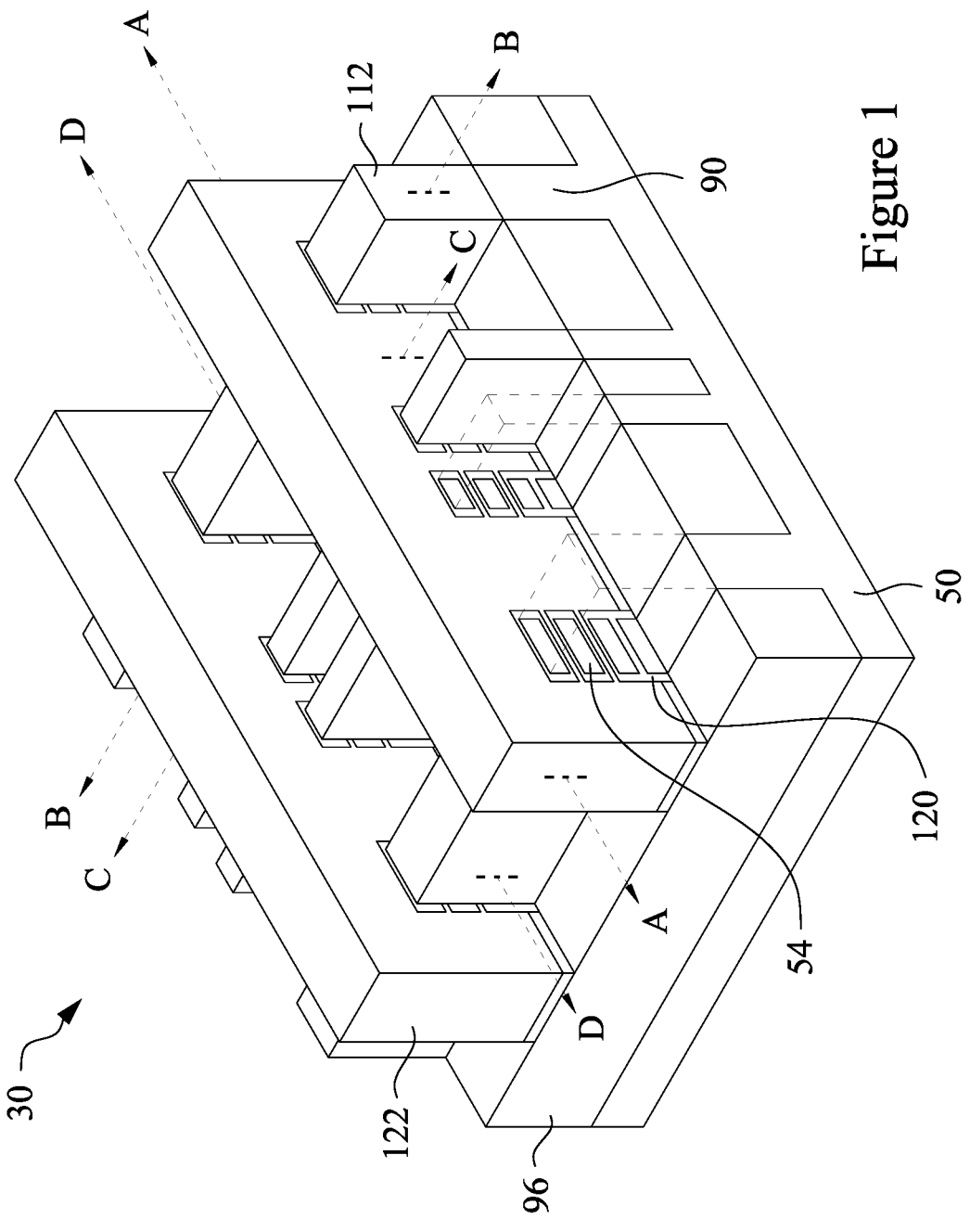
FIG. 1 illustrates an example of a nanostructure field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming contacts (e.g., gate contacts, source/drain contacts) for a nanostructure field-effect transistor (NSFET) device. The principle of the disclosure may also be applied for forming contacts in other types of devices, such as planar devices, fin field-effect transistor (FinFET) devices, and so on.

In accordance with some embodiments, to prevent a bowing profile of a contact (may also be referred to as a via), where the sidewall of the contact is no longer linear and has a bulging portion that extends into an adjacent dielectric layer, protection layers are formed in a via contact hole to form a strengthening structure, before electrically conductive material(s) is used to fill the via contact hole to form the contact. In some embodiments, a first protection layer comprising a metallic compound and a second protection layer comprising a semiconductor material are formed successively in the via contact hole in the dielectric layer. Next, an anisotropic etching process is performed to selectively remove horizontal portions of the second protection layer. Next, an isotropic etching process is performed to selectively remove portions of the first protection layer. After the isotropic etching process, a remaining portion of the first protection layer extends along sidewalls of the opening, and is interposed between a remaining vertical portion of the second protection layer and the dielectric layer. Next, a anneal process is performed to oxidize the remaining vertical portion of the second protection layer and convert it into a third protection layer. The remaining portion of the first protection layer and the third protection layer form the strengthening structure. Next, the opening is filled with an electrically conductive material to form the contact.

FIG. 1 illustrates an example of a nanostructure field-effect transistor (NSFET) device 30 in a three-dimensional view, in accordance with some embodiments. The NSFET device 30 comprises semiconductor fins 90 (also referred to as fins) protruding above a substrate 50. Gate electrodes 122 (e.g., metal gates) are disposed over the fins, and source/drain regions 112 are formed on opposing sides of the gate electrodes 122. A plurality of nanostructures 54 (e.g., nanowires, or nanosheets) are formed over the fins 90 and between source/drain regions 112. Isolation regions 96 are formed on opposing sides of the fins 90. A gate dielectric layer 120 is formed around the nanostructures 54. Gate electrodes 122 are over and around the gate dielectric layer 120.

FIG. 1 further illustrates reference cross-sections that are used in later figures. Cross-section A-A is along a longitudinal axis of the gate electrode 122 and in a direction, for example, perpendicular to the direction of current flow between the source/drain regions 112 of the NSFET device 30. Cross-section B-B is perpendicular to cross-section A-A and is along a longitudinal axis of the fin 90 and in a direction of, for example, a current flow between the source/drain regions 112 of the NSFET device. Cross-section C-C is parallel to cross-section B-B and between two neighboring fins 90. Cross-section D-D is parallel to cross-section A-A and extends through source/drain regions 112 of the NSFET device. Subsequent figures refer to these reference cross-sections for clarity.

FIGS. 2, 3A, 3B, 4A, 4B, 5A-5C, 6A-6C, 7A-7C, 8A, 8B, 9A, 9B, 10A, 10B, 11A, 11B, 12A, 12B, 13A, 13B, 14A, 14B, 15A, 15B, 16A, 16B, 17A, 17B, 18A-18D, and 19A-19D are cross-sectional views of a nanostructure field-effect transistor (NSFET) device 100 at various stages of manu-facturing, in accordance with an embodiment.

Figures 2, 3A, 3B:
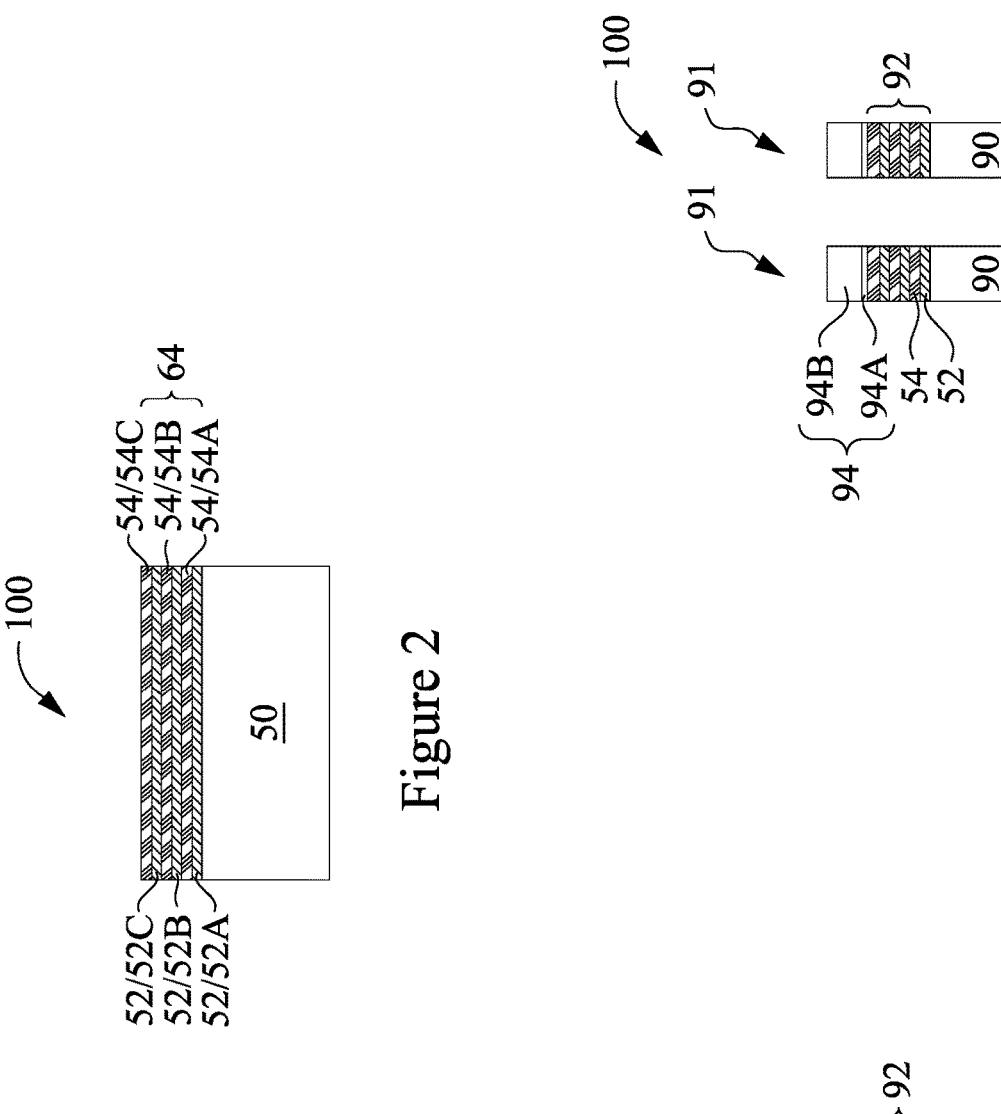

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semicon-ductor material 52 are labeled as 52A, 52B, and 52C, and layers formed by the second semiconductor material 54 are labeled as 54A, 54B, and 54C. The number of layers formed by the first and the second semiconductor materials illus-trated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of p-type FETs, such as silicon germanium ($Si_xGe_{1-x}$, where x can be in the range of 0 to 1), and the second semiconductor material 54 is an epitaxial material appropri-ate for forming channel regions of n-type FETs, such as silicon. The multi-layer stacks 64 (which may also be referred to as an epitaxial material stack) will be patterned to form channel regions of an NSFET in subsequent pro-cessing. In particular, the multi-layer stacks 64 will be patterned and etched to form horizontal nanostructures (e.g., nanosheets or nanowires), with the channel regions of the resulting NSFET including multiple horizontal nanostruc-tures.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germa-nium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target number of layers is formed.

FIGS. 3A, 3B, 4A, 4B, 5A-5C, 6A-6C. 7A-7C. 8A, 8B, 9A, 9B, 10A, 10B, 11A, 11B, 12A, 12B, 13A, 13B, 14A, 14B, 15A, 15B, 16A, 16B, 17A, 17B, 18A-18D, and 19A-19D are cross-sectional views of the NSFET device 100 at subsequent stages of manufacturing, in accordance with an embodiment. FIGS. 3A, 4A, 5A, 6A, 7A, 8A, 9A, 10A. 11A, 12A, 13A, 14A, 15A, 16A, 17A, 18A, and 19A are cross-sectional views along cross-section B-B in FIG. 1. FIGS. 3B, 4B, 5C, 6C, 7C, 8B, 9B, 10B, 11B, 12B, 13B, 14B. 15B, 16B, 17B, 18B, and 19B are cross-sectional views along cross-section A-A in FIG. 1. FIGS. 5B, 6B, and 7B are cross-sectional views along cross-section D-D in FIG. 1. FIGS. 18C and 19C are zoomed-in views of a portion of the NSFET device 100, in an embodiment. FIGS. 18D and 19D are zoomed-in views of a portion of the NSFET device 100, in another embodiment. Two fins and two gate structures are illustrated in the figures as a non-limiting example, it should be appreciated that other numbers of fins and other numbers of gate structures may also be formed.

In FIGS. 3A and 3B, fin structures 91 are formed pro-truding above the substrate 50. Each of the fin structures 91 includes a semiconductor fin 90 (also referred to as a fin) and a layer stack 92 overlying the semiconductor fin 90. The layer stack 92 and the semiconductor fin 90 may be formed by etching trenches in the multi-layer stack 64 and the substrate 50, respectively. The layer stack 92 and the semi-conductor fin 90 may be formed by a same etching process.

The fin structures 91 may be patterned by any suitable method. For example, the fin structures 91 may be patterned using one or more photolithography processes, including double-patterning or multi-patterning processes. Generally, double-patterning or multi-patterning processes combine photolithography and self-aligned processes, allowing pat-terns to be created that have, for example, pitches smaller than what is otherwise obtainable using a single, direct photolithography process. For example, in one embodiment, a sacrificial layer is formed over a substrate and patterned using a photolithography process. Spacers are formed along-side the patterned sacrificial layer using a self-aligned pro-cess. The sacrificial layer is then removed, and the remaining spacers may then be used to pattern, e.g., the fin structures 91.

In some embodiments, the remaining spacers are used to pattern a mask 94, which is then used to pattern the fin structures 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 forms the layer stack 92, and the patterned substrate 50 forms the fin 90, as illustrated in FIGS. 3A and 3B. Therefore, in the illustrated embodiment, the layer stack 92 also includes alternating layers of the first semiconductor material 52 and the second semiconductor material 54, and the fin 90 is formed of a same material (e.g., silicon) as the substrate 50.

Figure 4B:
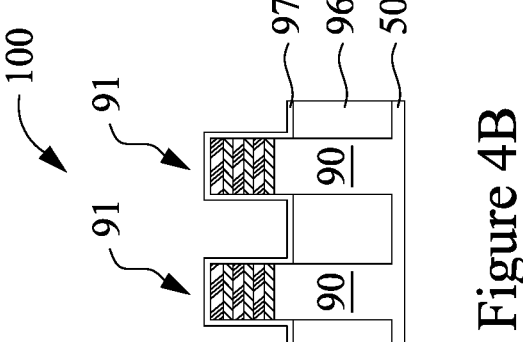
Figure 4A:
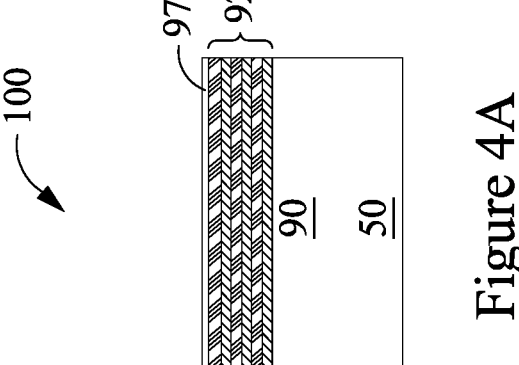

Next, in FIGS. 4A and 4B, Shallow Trench Isolation (STI) regions 96 are formed over the substrate 50 and on opposing sides of the fin structures 91. As an example to form the STI regions 96, an insulation material may be formed over the substrate 50. The insulation material may be an oxide such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed after the insulation material is formed.

In some embodiments, the insulation material is formed such that excess insulation material covers the fin structures 91. In some embodiments, a liner is first formed along surfaces of the substrate 50 and fin structures 91, and a fill material, such as those discussed above is formed over the liner. In some embodiments, the liner is omitted.

Next, a removal process is applied to the insulation material to remove excess insulation material over the fin structures 91. In some embodiments, a planarization process such as a chemical mechanical polish (CMP), an etch back process, combinations thereof, or the like, may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the semiconductor fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the fin 90 and the layer stack 92). For example, a chemical oxide removal with a suitable etchant such as dilute hydrofluoric (dHF) acid may be used.

Still referring to FIGS. 4A and 4B, a dummy dielectric layer 97 is formed over the layer stack 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidization process is performed to convert the deposited silicon layer into an oxide layer as the dummy dielectric layer 97.

Next, in FIGS. 5A-5C, dummy gates 102 are formed over the fin structures 91. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystal-line silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the STI regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the layer stacks 92. The pattern of the masks 104 may be used to physically separate each of the dummy gates 102 from adjacent dummy gates. The dummy gates 102 may also have a lengthwise direction substantially perpendicular to the lengthwise direction of the fin structures 91. The dummy gate 102 and the dummy gate dielectric 97 are collectively referred to as dummy gate structure, in some embodiments.

Next, a gate spacer layer 108 is formed by conformally depositing an insulating material over the layer stacks 92, the STI regions 96, and the dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIGS. 5B and 5C illustrate cross-sectional views of the NSFET device 100 in FIG. 5A along cross-sections E-E and F-F in FIG. 5A, respectively. The cross-sections E-E and F-F correspond to cross-sections D-D and A-A in FIG. 1, respectively.

Next, in FIGS. 6A-6C, the gate spacer layers 108 are etched by an anisotropic etching process to form gate spacers 108. The anisotropic etching process may remove horizontal portions of the gate spacer layer 108 (e.g., portions over the STI regions 96 and the dummy gates 102), with remaining vertical portions of the gate spacer layer 108 (e.g., portions along sidewalls of the dummy gates 102 and the dummy gate dielectric 97) forming the gate spacers 108.

After the formation of the gate spacers 108, implantation for lightly doped source/drain (LDD) regions (not shown) may be performed. Appropriate type (e.g., p-type or n-type) impurities may be implanted into the exposed layer stacks 92 and/or semiconductor fins 90. The n-type impurities may be any suitable n-type impurities, such as phosphorus, arsenic, antimony, or the like, and the p-type impurities may be any suitable p-type impurities, such as boron, $BF_2$, indium, or the like. The lightly doped source/drain regions may have a concentration of impurities of from about $10^{15}$ $cm^{-3}$ to about $10^{16}$ $cm^{-3}$. An anneal process may be used to activate the implanted impurities.

Next, openings 110 (which may also be referred to as recesses) are formed in the layer stacks 92. The openings 110 may extend through the layer stacks 92 and into the fins 90. The openings 110 may be formed by an anisotropic etching process using, e.g., the dummy gates 102 and the gate spacers 108 as an etching mask.

After the openings 110 are formed, a selective etching process is performed to recess end portions of the first semiconductor material 52 exposed by the openings 110 without substantially attacking the second semiconductor material 54. After the selective etching process, recesses (also referred to as sidewall recesses) are formed in the first semiconductor material 52 at locations where the removed end portions used to be.

Next, an inner spacer layer is formed (e.g., conformally) in the openings 110. The inner spacer layer also fills the sidewall recesses of the first semiconductor material 52 formed by the previous selective etching process. The inner spacer layer may be a suitable dielectric material, such as silicon carbonitride (SiCN), silicon oxycarbonitride (SiOCN), or the like, formed by a suitable deposition method such as PVD, CVD, atomic layer deposition (ALD), or the like. Next, an etching process, such as an anisotropic etching process, is performed to remove portions of the inner spacer layers disposed outside the sidewall recesses of the first semiconductor material 52. The remaining portions of the inner spacer layers (e.g., portions disposed inside the sidewall recesses of the first semiconductor material 52) form inner spacers 55. As illustrated in FIG. 6A, the openings 110 expose sidewalls of the second semiconductor material 54 and expose an upper surface 90U of the fin 90.

FIGS. 6B and 6C illustrate cross-sectional views of the NSFET device 100 in FIG. 6A along cross-sections E-E and F-F, respectively. In FIG. 6B, the portions of the gate spacer layer 108 disposed on the upper surface of the STI regions 96 between neighboring fins 90 are completely removed by the anisotropic etching process used for forming the gate spacers 108. In some embodiments, portions of the gate spacer layer 108 are left (e.g., remain) between neighboring fins 90 on the upper surface of the STI regions 96. Those portions of the gate spacer layer 108 may be left because the anisotropic etching process discussed above may not completely remove the gate spacer layer 108 disposed between neighboring fins 90, due to the small distance between the neighboring fins 90 reducing efficiency of the anisotropic etching process.

Figure 7A:
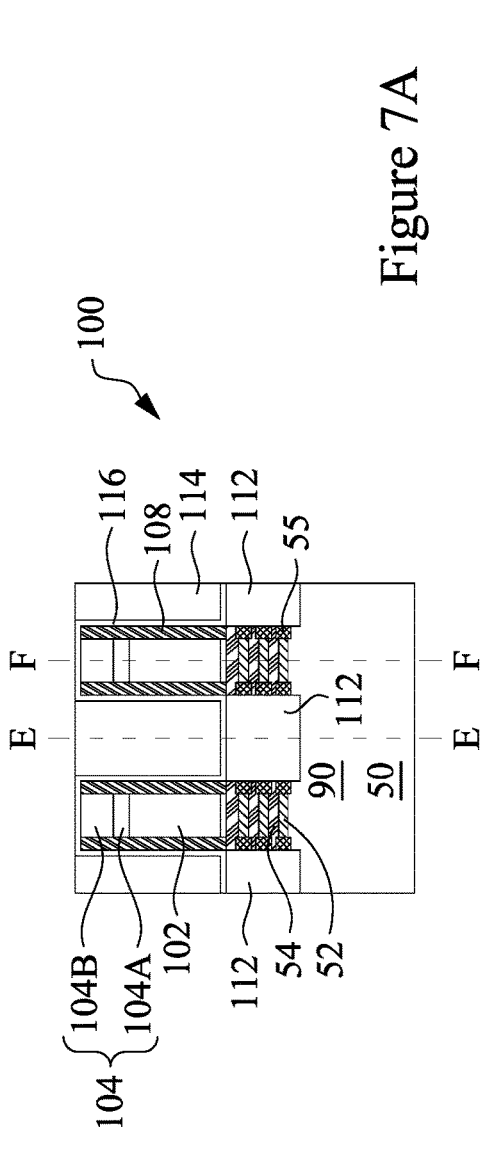
Figure 7C:
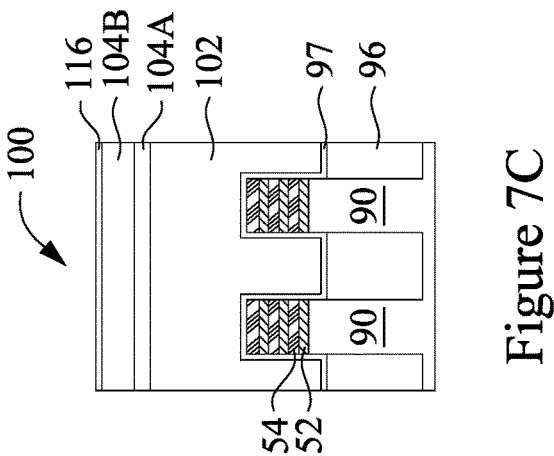
Figure 7B:
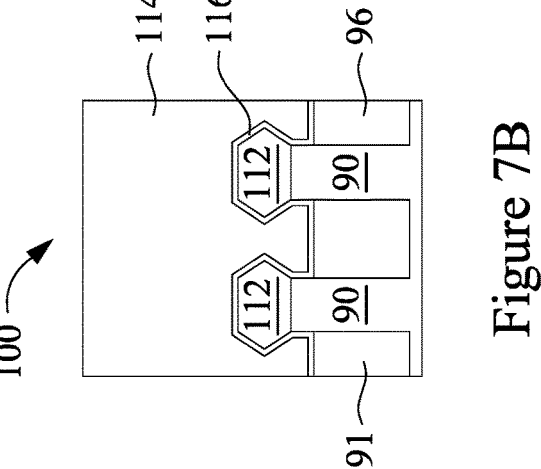

Next, in FIGS. 7A-7C, source/drain regions 112 are formed in the openings 110. In the discussion herein, source/drain region(s) may refer to a source or a drain, individually or collectively dependent upon the context. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. In some embodiments, the epitaxial source/drain regions 112 are formed such that the dummy gate 102 is disposed between respective neighboring pairs of the epitaxial source/drain regions 112. In some embodiments, the gate spacers 108 are used to separate the epitaxial source/drain regions 112 from the dummy gates 102 by an appropriate lateral distance so that the epitaxial source/drain regions 112 do not short out subsequently formed gates of the resulting NSFET device.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins 90 and may have facets.

The epitaxial source/drain regions 112 and/or the fins 90 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 91. In the illustrated embodiment, adjacent epitaxial source/drain regions 112 remain separated (see FIG. 7B) after the epitaxy process is completed. In other embodiments, these facets cause adjacent epitaxial source/drain regions 112 of a same NSFET to merge.

Next, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. FIGS. 7B and 7C illustrate cross-sectional views of the NSFET device 100 of FIG. 7A, but along cross-section E-E and F-F in FIG. 7A, respectively.

Figure 8B:
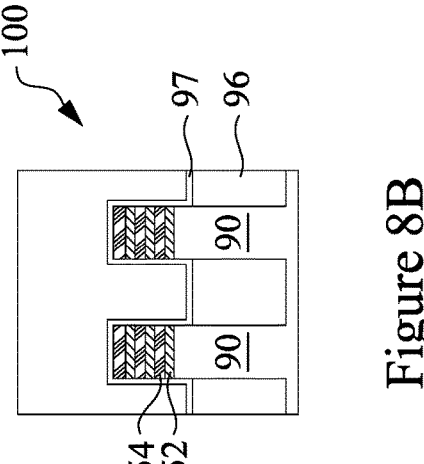
Figure 8A:
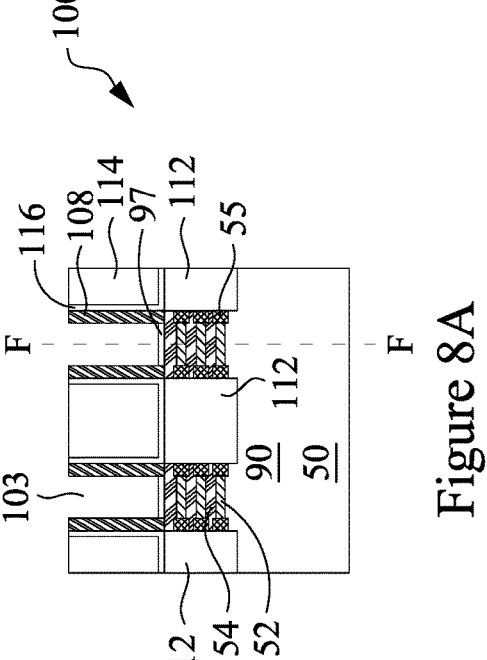

Next, in FIGS. 8A and 8B, the dummy gates 102 are removed. To remove the dummy gates 102, a planarization process, such as a CMP, is performed to level the top surfaces of the first ILD 114 and CESL 116 with the top surfaces of the dummy gates 102 and gate spacers 108. The planarization process may also remove the masks 104 (see FIG. 7A) on the dummy gates 102, and portions of the gate spacers 108 along sidewalls of the masks 104. After the planarization process, top surfaces of the dummy gates 102, gate spacers 108, CESL 116, and first ILD 114 are level. Accordingly, the top surfaces of the dummy gates 102 are exposed through the first ILD 114.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes a channel region of the NSFET. Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102. FIG. 8B illustrates the cross-sectional view of the NSFET device 100 of FIG. 8A along the cross-section F-F.

Figure 9B:
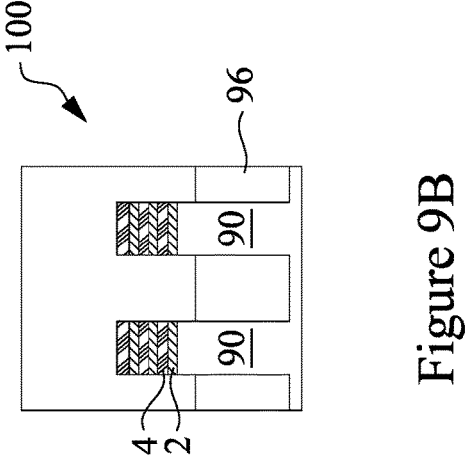
Figure 9A:
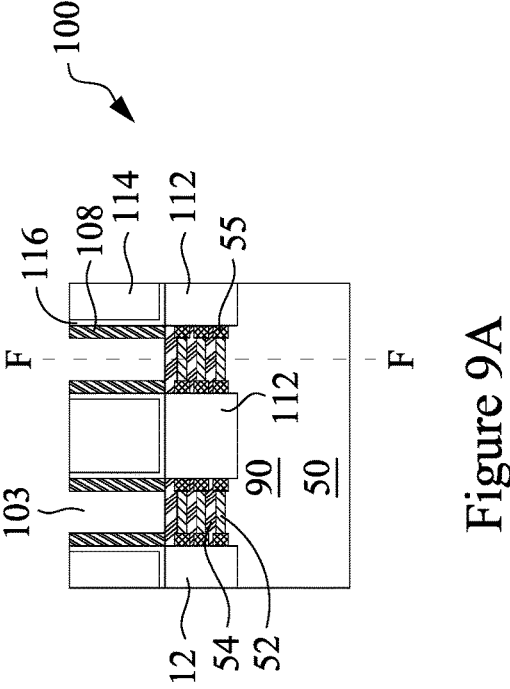

Next, in FIGS. 9A and 9B, the dummy gate dielectric 97 in the recesses 103 is removed. An etching process, such as an isotropic etching process, may be performed to remove the dummy gate dielectric 97. In an embodiment, an isotropic etching process using an etching gas that comprises HF and $NH_3$ is performed to remove the dummy gate dielectric 97.

Figure 10B:
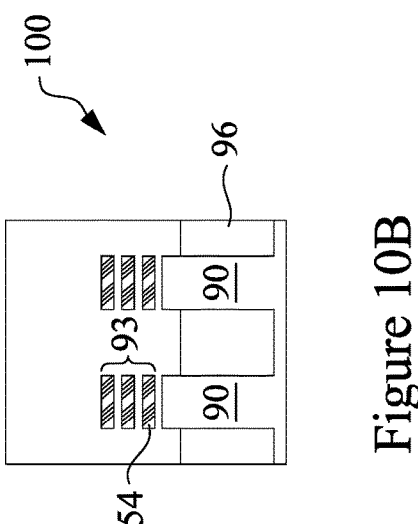
Figure 10A:
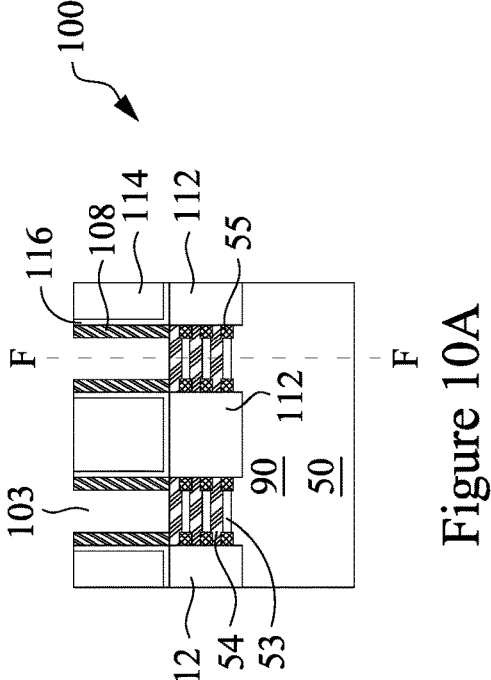

Next, in FIGS. 10A and 10B, the first semiconductor material 52 (e.g., portions exposed by the recesses 103) is removed to release the second semiconductor material 54. After the first semiconductor material 52 is removed, the second semiconductor material 54 (e.g., portions underlying the dummy gates 102 before the dummy gates 102 are removed) forms a plurality of nanostructures 54 that extend horizontally (e.g., parallel to a major upper surface of the substrate 50). The nanostructures 54 may be collectively referred to as the channel regions 93 or the channel layers 93 of the NSFET device 100 formed. As illustrated in FIG. 10A, gaps 53 (e.g., empty spaces) are formed between the nanostructures 54 by the removal of the first semiconductor material 52. In some embodiments, the nanostructures 54 are nanosheets or nanowires, depending on, e.g., the dimensions (e.g., size and/or aspect ratio) of the nanostructures 54.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In some embodiments, an isotropic etching process is performed to remove the first semiconductor material 52. The isotropic etching process is performed using an etching gas, and optionally, a carrier gas, where the etching gas comprises $F_2$ and HF, and the carrier gas may be an inert gas such as Ar, He, $N_2$, combinations thereof, or the like, in some embodiments.

FIG. 10A illustrates the cross-sectional view of the NSFET device 100 along a longitudinal axis of the fin (e.g., along a current flow direction in the fin), and FIG. 10B illustrates the cross-sectional view of the NSFET device 100 along cross-section F-F, which is a cross-section along a direction perpendicular to the longitudinal axis of the fin and across a middle portion of the nanostructure 54.

As illustrated in FIG. 10A, each of the nanostructures 54 has a rectangular shaped cross-section along the longitudinal axis of the fin. Similarly, in FIG. 10B, in a cross-section along a direction perpendicular to the longitudinal axis of the fin and across a middle portion of the nanostructure 54, each of the nanostructures 54 has a rectangular shaped cross-section.

Figure 11B:
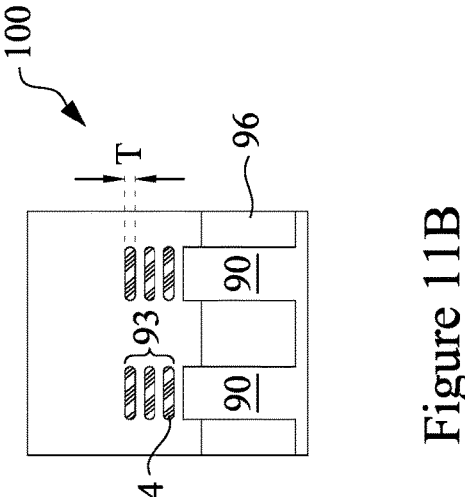
Figure 11A:
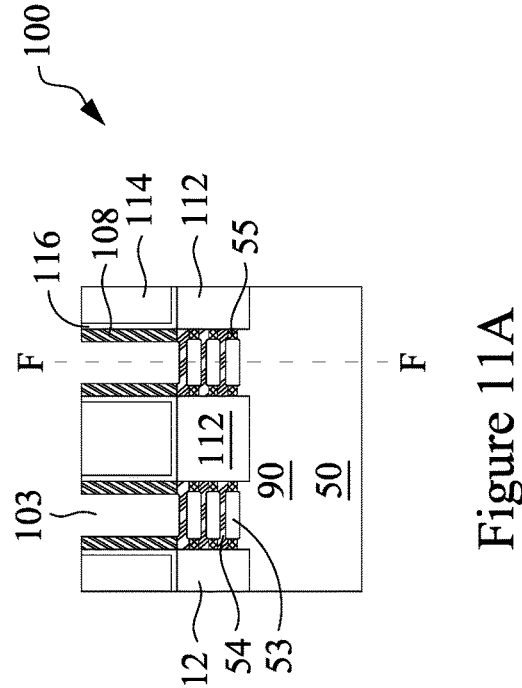

Next, in FIGS. 11A and 11B, the nanostructures 54 are reshaped by a nanostructure reshaping process (e.g., an isotropic etching process). In some embodiments, the nanostructures 54 are reshaped by a selective etching process using an etchant that is selective to the material of the nanostructures 54 (e.g., the second semiconductor material 54), such that the nanostructures 54 are etched without substantially attacking other materials in the NSFET device 100, such as oxide, silicon nitride, and low-K dielectric materials.

In some embodiments, the isotropic etching process (e.g., a selective etching process) to reshape the nanostructures 54 is performed using an etching gas, and optionally, a carrier gas, where the etching gas comprises $F_2$ and $NH_3$, and the carrier gas may be an inert gas such as Ar, He, $N_2$, combinations thereof, or the like.

Besides using a mixture of $F_2$ and $NH_3$ as the etching gas, other suitable etching gases, such as $ClF_3$, or a mixture of $NF_3$ and $NH_3$, may alternatively be used as the etching gas to reshape the nanostructures 54. For example, an isotropic etching process (e.g., an isotropic plasma etching process) using an etching gas comprising $NF_3$ and $NH_3$ may be performed to reshape the nanostructures 54.

The nanostructure reshaping process thins the middle portion of each nanostructure 54 while the end portions of the nanostructure 54 remain substantially unchanged, thus generating a dumbbell shaped cross-section for the nanostructure 54 in FIG. 11A. In addition, the nanostructure re-shaping process removes the sharp edges (e.g., see the 90-degree edges of the nanostructures 54 in FIG. 10B) of the nanostructures 54, thus generating rounded edges for each nanostructure 54 (see the rounded corners of each nanostructure 54 in FIG. 11B), as described in more details below.

As illustrated in FIG. 11A, after the nanostructure reshaping process, in the cross-section along the longitudinal axis of the fin, each of the nanostructures 54 has a dumbbell shape, where end portions of the nanostructure 54 (e.g., portions physically contacting the source/drain regions 112) have a thickness (measured along the vertical direction of FIG. 11A) larger than that of the middle portion (e.g., a portion mid-way between the end portions). In some embodiments, a difference between the thicknesses of the end portion of the nanostructure 54 and the middle portion of the nanostructure 54 is between about 0 nm and about 3 nm. In the example of FIG. 11A, the upper surface and the lower surface of the middle portion of each nanostructure 54 are illustrated as level surfaces (e.g., flat surfaces). This is, of course, merely a non-limiting example. In some embodiments, the upper surface and lower surface of the middle portion of each nanostructure 54 are curved, such as curved toward a horizontal center axis of the nanostructure 54. In addition, in the cross-section of FIG. 11B, each of the nanostructures 54 has a stadium shape (may also be referred to as a racetrack shape, a discorectangle shape, an obround shape, or a sausage body shape). In particular, in the cross-section of FIG. 11B, the corners of each nanostructure 54 are rounded (e.g., curved). In some embodiments, a thickness T of the nanostructure 54, measured in the middle portion, is between about 3 nm and about 7 nm.

As feature sizes continue to shrink in advanced processing nodes, the distance between adjacent nanostructures 54 may become so small that it may be difficult to form layers (e.g., gate dielectric layer) around the nanostructures 54 in subsequent processing. By reshaping the nanostructures 54, e.g., thinning the middle portions of the nanostructures 54, the distance between adjacent nanostructures 54 is increased, thus making it easier to form, e.g., gate dielectric layer 120 (see FIGS. 12A and 12B) around the nanostructures 54. In addition, since the thickness T of the nanostructures 54, which form the channel regions 93 of the NSFET device 100, is reduced by the nanostructure reshaping process, it is easier to control (e.g., turning on or off) the NSFET device 100 by applying a gate control voltage on the metal gate formed in subsequent processing.

In some embodiments, the nanostructure reshaping process illustrated in FIGS. 11A and 11B is omitted. In subsequent figures, the channel regions 93 of the NSFET device 100 are illustrated as having the cross-sections of FIGS. 11A and 11B, with the understanding that the channel regions 93 may have the cross-sections of FIGS. 10A and 10B (e.g., when the nanostructure reshaping process is omitted).

Figure 12B:
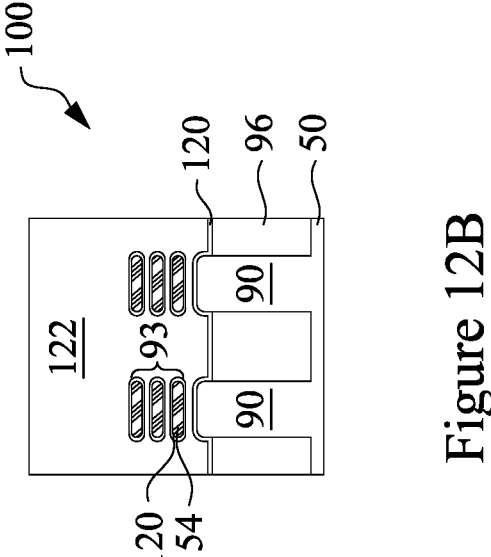
Figure 12A:
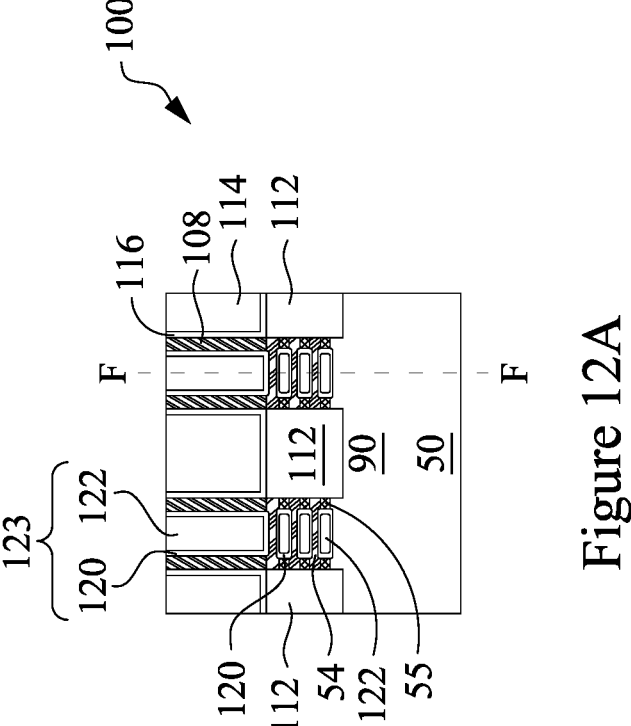

Next, in FIGS. 12A and 12B, gate dielectric layers 120 and gate electrodes 122 are formed for replacement gates. The gate dielectric layers 120 are deposited conformally in the recesses 103, such as on the top surfaces and the sidewalls of the semiconductor fin 90, and on sidewalls of the gate spacers 108. The gate dielectric layers 120 may also be formed on the top surface of the first ILD 114. Notably, the gate dielectric layers 120 wrap around the nanostructures 54. In accordance with some embodiments, the gate dielectric layers 120 comprise silicon oxide, silicon nitride, or multilayers thereof. In some embodiments, the gate dielectric layers 120 include a high-k dielectric material, and in these embodiments, the gate dielectric layers 120 may have a k value greater than about 7.0, and may include a metal oxide or a silicate of Hf, Al, Zr, La, Mg, Ba, Ti, or Pb, or combinations thereof. The formation methods of the gate dielectric layers 120 may include Molecular-Beam Deposition (MBD), ALD, PECVD, and the like.

Next, the gate electrodes 122 are deposited over and around the gate dielectric layers 120, and fill the remaining portions of the recesses 103. The gate electrodes 122 may include a metal-containing material such as TIN, TiO, TaN, TaC, Co, Ru, Al, W, combinations thereof, or multi-layers thereof. For example, although a single layer gate electrode 122 is illustrated, the gate electrode 122 may comprise any number of liner layers (e.g., barrier layers), any number of work function tuning layers, and a fill material. After the filling of the gate electrodes 122, a planarization process, such as a CMP, may be performed to remove the excess portions of the gate dielectric layers 120 and the material of the gate electrodes 122, which excess portions are over the top surface of the first ILD 114. The remaining portions of material of the gate electrodes 122 and the gate dielectric layers 120 thus form replacement gates of the resulting NSFET device 100. Each gate electrode 122 and the corresponding gate dielectric layers 120 may be collectively referred to as a gate stack 123, a replacement gate structure 123, a metal gate structure 123, or a gate structure 123. Each gate structure 123 extends around the respective nanostructures 54.

Figure 13B:
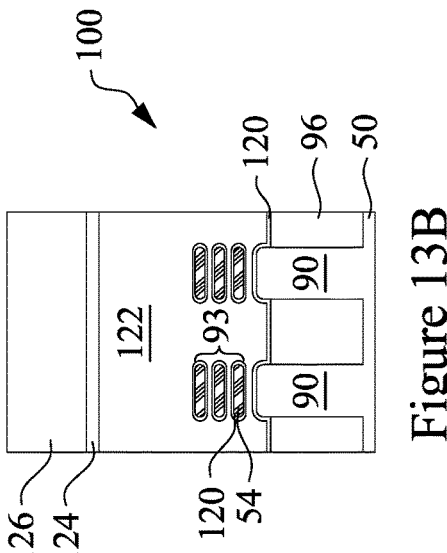
Figure 13A:
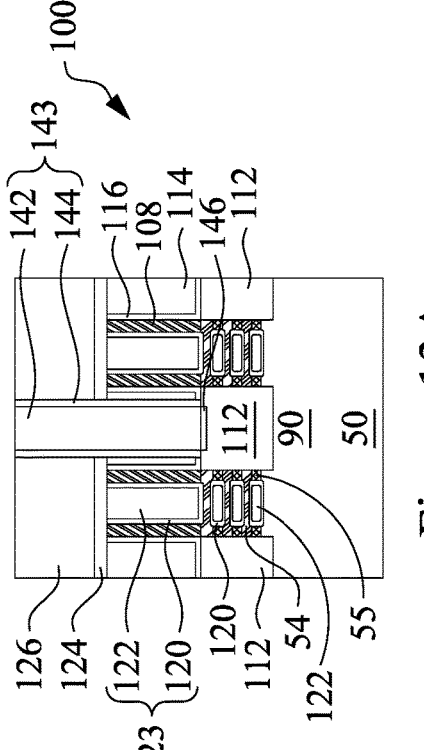

Next, in FIGS. 13A and 13B, an etch stop layer 124 is formed over the first ILD 114 and over the gate structure 123, and a second ILD 126 is formed over the etch stop layer 124. In some embodiments, the etch stop layer 124 is omitted, and the second ILD 126 is formed directly on the first ILD 114.

The etch stop layer 124 is formed of a material different from that of the first ILD 114. For example, the etch stop layer 124 may be formed of silicon nitride, silicon oxynitride, or the like, by a suitable formation method such as CVD, ALD, or the like. The second ILD 126 may be formed of a same or similar material as the first ILD 114, using a same or similar formation method, thus details are not repeated.

Next, source/drain vias 143 (may also be referred to as source/drain contacts) are formed that extend through the second ILD 126 and the etch stop layer 124 (if formed) to be electrically coupled to the source/drain regions 112. For simplicity, FIG. 13A and subsequent figures may only illustrate one source/drain via 143, with the understanding that each source/drain region 112 may have a respective overlying source/drain via 143 coupled to the source/drain region 112. Each source/drain via 143 may comprise a barrier layer 144 and an electrically conductive material 142. In addition, a silicide region 146 may be formed over each source/drain region 112 before the corresponding source/drain via 143 is formed.

In some embodiments, to form the source/drain vias 143, openings are formed in the second ILD 126 and the etch stop layer 124 (if formed) to expose the respective underlying source/drain regions 112. Next, the barrier layer 144 is formed (e.g., conformally) to line the bottoms and the sidewalls of the openings. The barrier layer 144 may comprise an electrically conductive material such as titanium nitride, although other materials, such as tantalum nitride, titanium, tantalum, or the like, may also be utilized. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used.

Next, an anisotropic etching process is performed to remove the barrier layer 144 from the bottoms of the openings for the source/drain vias 143 to expose the underlying source/drain regions 112, while the barrier layer 144 along the sidewalls of the openings for the source/drain vias 143 remain. Next, the silicide regions 146 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 112, then performing a thermal anneal process to form the silicide regions 146. The un-reacted portions of the deposited metal are then removed, e.g., by an etching process. Although regions 146 are referred to as silicide regions, regions 146 may also be germanide regions, or silicon germanide regions (e.g., regions comprising silicide and germanide).

Next, the electrically conductive material 142 is formed to fill the openings for the source/drain vias 143. The electrically conductive material 142 may comprise copper, although other suitable materials such as tungsten, cobalt, alloys, doped polysilicon, combinations thereof, or the like, may alternatively be utilized. The electrically conductive material 142 may be formed by depositing a seed layer and then electroplating copper onto the seed layer, filling and overfilling the openings for the source/drain vias 143. Once the openings for the source/drain vias 143 have been filled, excess barrier layer 144 and excess electrically conductive material 142 outside of the openings for the source/drain vias 143 may be removed through a grinding process such as chemical mechanical polishing (CMP), although any suitable removal process may be used. The remaining portions of the barrier layer 144 and the electrically conductive material 142 in the openings form the source/drain vias 143.

Figure 14B:
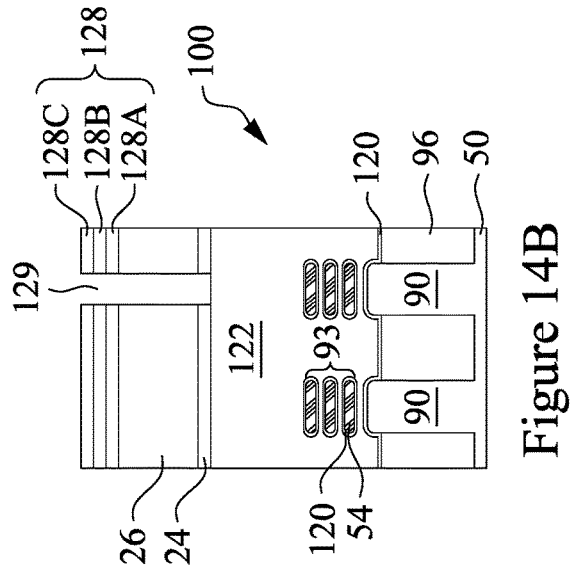
Figure 14A:
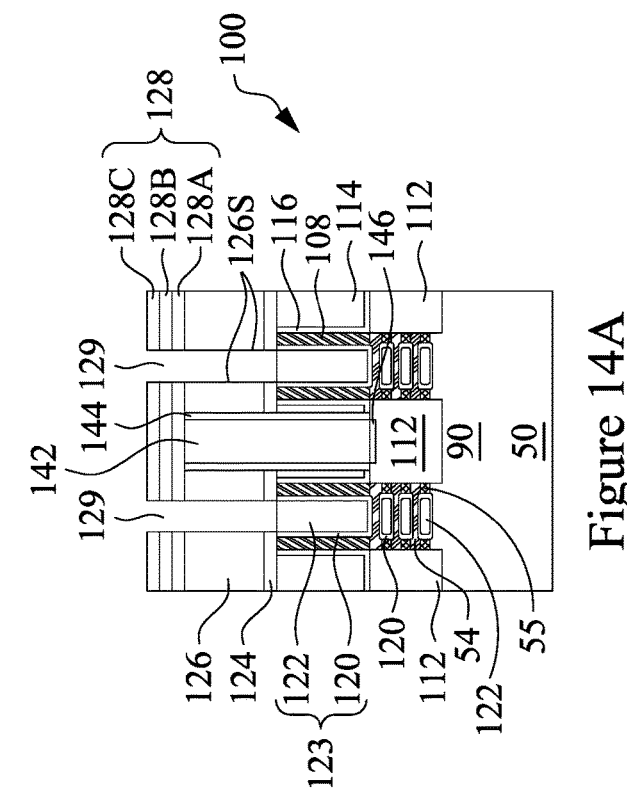

Next, in FIGS. 14A and 14B, a tri-layered photoresist 128, which includes a top photoresist layer 128C, a middle layer 128B, and a bottom anti-reflective coating (BARC) layer 128A, is formed over the second ILD 126. The BARC layer 128A of the tri-layered photoresist 128 may comprise an organic or inorganic material. The middle layer 128B may comprise silicon nitride, silicon oxynitride, or the like, that has an etch selectivity to the top photoresist layer 128C, such that the top photoresist layer 128C can be used as a mask layer to pattern the middle layer 128B. The top photoresist layer 128C may comprise a photosensitive material. Any suitable deposition method, such as PVD, CVD, spin coating, the like, or combinations thereof, may be used to form the tri-layered photoresist 128.

Once the tri-layered photoresist 128 is formed, patterns (e.g., openings) are formed in the top photoresist layer 128C. In an embodiment, the top photoresist layer 128C is patterned by exposing the photosensitive material within the top photoresist layer 128C to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the top photoresist layer 128C are different from the physical properties of the unexposed portions of the top photoresist layer 128C. The top photoresist layer 128C may then be developed with a developer to remove the exposed portion of the top photoresist layer 128C or the unexposed portion of the top photoresist layer 128C, depending on, e.g., whether a negative photosensitive material or a positive photosensitive material is used for the top photoresist layer 128C. The remaining portions of the top photoresist layer 128C form a patterned photoresist layer. Next, the patterns in the top photoresist layer 128C are extended through the middle layer 128B and the BARC layer 128A, and are transferred to the second ILD 126 and the etch stop layer 124 (if formed) using a suitable method, such as one or more anisotropic etching processes, to forms openings 129 (also referred to as via contact holes) in the second ILD 126 and the etch stop layer 124. As illustrated in FIGS. 14A and 14B, the openings 129 expose the upper surfaces of the gate electrodes 122, sidewalls 126S of the second ILD 126, and sidewalls of the etch stop layer 124 (if formed).

Figures 15A, 15B:
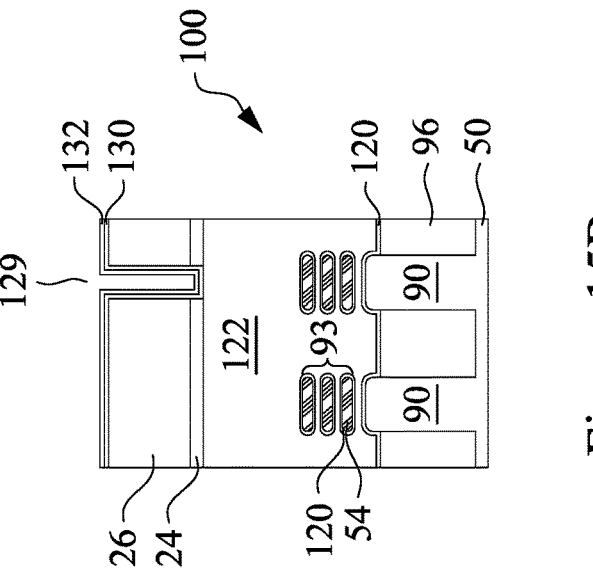

Next, in FIGS. 15A and 15B, a protection layer 130 is formed (e.g., conformally) over the upper surface of the second ILD 126 and in the openings 129. Next, a protection layer 132 is formed (e.g., conformally) over the protection layer 130. The protection layers 130 and 132 are formed of different materials, in the illustrated embodiment. The protection layers 130 and 132 are used to prevent the subsequently formed gate contact material (see, e.g., 140 in FIG. 19A) from protruding into, e.g., the second ILD 126, details are discussed hereinafter.

In some embodiments, the protection layer 130 is formed of dielectric material, such as a metallic compound that includes a metal material and a non-metal material. For example, the protection layer 130 may be formed of aluminum oxide, aluminum nitride, aluminum oxynitride, or the like. A suitable formation method, such as ALD, CVD, or the like, may be used to form the protection layer 130. A thickness of the protection layer 130 may be between about 1 nm and about 10 nm, as an example. As illustrated in FIGS. 15A and 15B, the protection layer 130 lines sidewalls and bottoms of the openings 129.

In some embodiments, the protection layer 132 is formed of a semiconductor material (may also be referred to as a semiconductive material or a semiconducting material), such as silicon or germanium. A suitable formation method, such as plasma vapor deposition, CVD, or the like, may be used to form the protection layer 132. A thickness of the protection layer 132 may be between about 1 nm and about 20 nm, as an example.

Figure 16B:
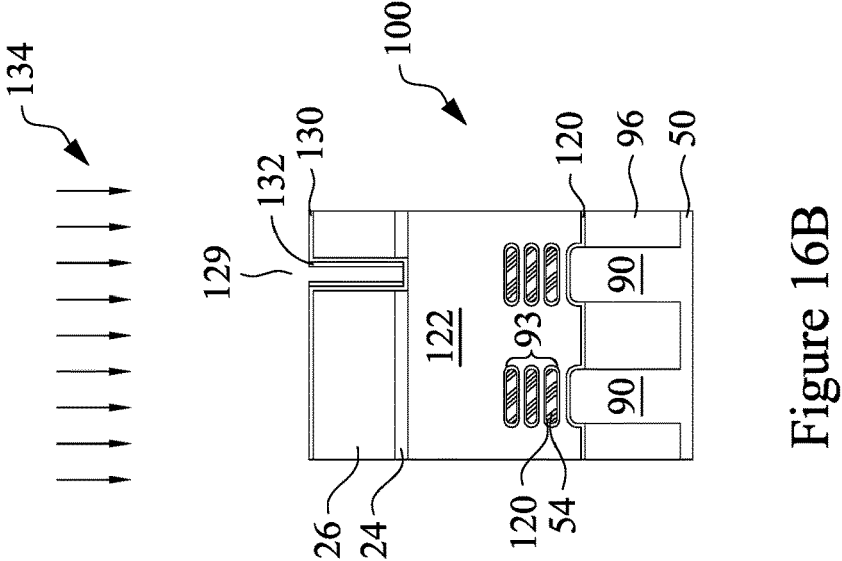
Figure 16A:
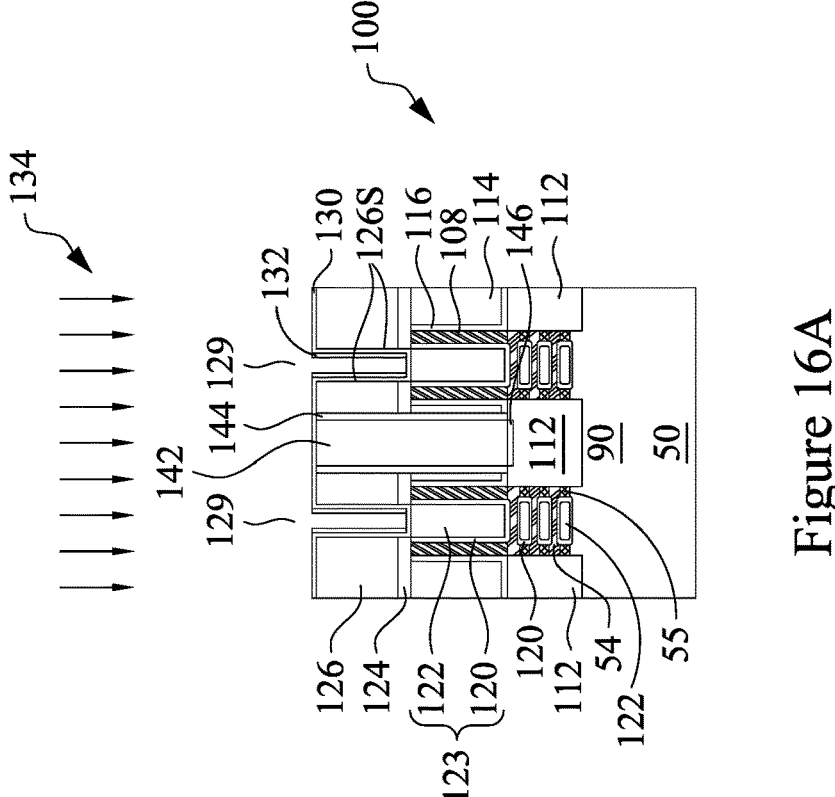

Next, in FIGS. 16A and 16B, an anisotropic etching process 134 is performed to remove the protection layer 132 from the upper surface of the second ILD 126 and from the bottoms of the openings 129. After the anisotropic etching process 134, a remaining portion of the protection layer 132 (e.g., a vertical portion) extends along sidewalls 126S of the second ILD 126, and covers a portion of the protection layer 130 disposed along the sidewalls 126S of the second ILD 126. Other portions of protection layer 130, such as portions along the upper surface of the second ILD 126 and along the bottoms of the openings 129, are exposed by (e.g., free of) the protection layer 132, in the illustrated embodiment.

In some embodiments, the anisotropic etching process 134 is performed using an etchant that is selective to (e.g., having a higher etch rate for) the material of the protection layer 132, such that the protection layer 132 is etched without substantially attacking the protection layer 130. For example, the anisotropic etching process 134 may be a plasma etching process performed using a hydrofluorocarbon gas (e.g., $CH_3F$ or $C_4H_8F_2$) as the etching gas. A flow rate of the hydrofluorocarbon gas may be between about 5 standard cubic center meters per minute (sccm) and about 50 sccm. A pressure of the anisotropic etching process 134 may be between about 5 mTorr and about 20 mTorr. A temperature of the anisotropic etching process 134 may be between about 30° C. and about 50° C. A duration of the anisotropic etching process 134 may be between about 10 seconds and about 120 seconds.

Figure 17B:
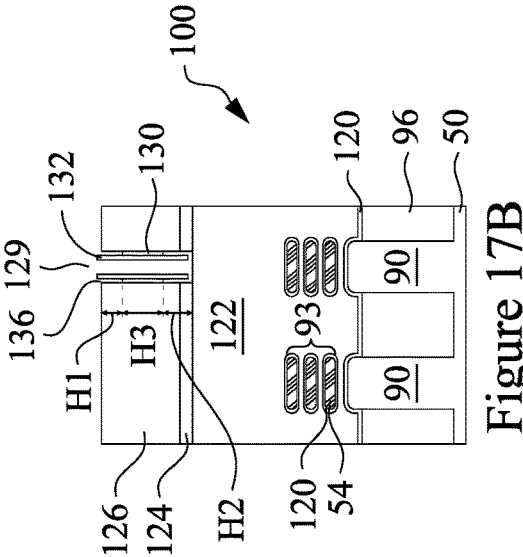
Figure 17A:
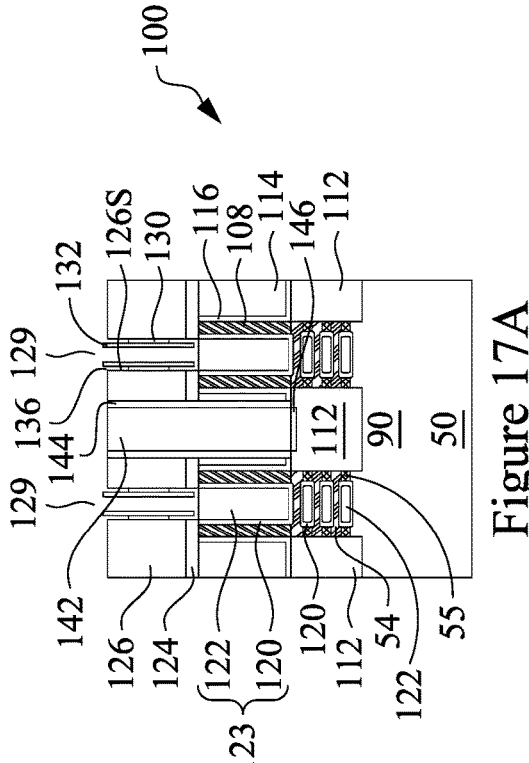

Next, in FIGS. 17A and 17B, an isotropic etching process is performed to remove the protection layer 130 from the upper surface of the second ILD 126 and from the bottoms of the openings 129. The isotropic etching process is performed using an etchant that is selective to the material of the protection layer 130, such that the protection layer 130 is etched without substantially attacking other layers such as the protection layer 132 or the second ILD 126. Notably, the etchant (e.g., an etching fluid) of the isotropic etching process enters into places between the remaining portion of the protection layer 132 and the sidewalls 126S of the second ILD 126. Therefore, an upper sidewall portion of the protection layer 130 distal from the gate structure 123 and a lower sidewall portion of the protection layer 130 proximate to the gate structure 123 are removed by the etchant, and a middle sidewall portion of the protection layer 130 between the upper sidewall portion and the lower sidewall portion of the protection layer 130 remains along the sidewalls 126S of the second ILD 126, as illustrated in FIGS. 17A and 17B. In some embodiments, the etching depth H1 and H2 of the isotropic etching process is between about 10 nm and about 100 nm, and a height H3 of the remaining portion of the protection layer 130 is between about 5 nm and about 100 nm.

After the isotropic etching process, gaps 136 are formed between the remaining portion of the protection layer 132 and the sidewalls 126S of the second ILD 126. Note that the gap 136 does not extend continuously from the upper surface of the second ILD 126 to the bottom of the opening 129, because the remaining middle sidewall portion of the protection layer 130 is disposed at (e.g., fills) the middle portion of the gap 136. In addition, the bottom surface of the remaining portion of the protection layer 132 facing the gate structure 123 is spaced apart from the gate structure 123. In other words, there is a gap between the bottom surface of the remaining portion of the protection layer 132 and the gate structure 123.

In some embodiments, the isotropic etching process is a wet etching process performed using an etchant, such as an alkaline etchant (e.g., ammonium hydroxide or water-soluble amine) or an acidic etchant (e.g., hydrogen chloride). The etchant is mixed in an aqueous solution with a volume concentration higher than 1%, such as between 1% and 20%, in an embodiment. A PH buffer chemical, such as ammonium fluoride, may be used to fine-tune the PH value of the aqueous solution. A temperature of the isotropic etching process (e.g., wet etching) is between about 25° C. and about 100° C., and a duration of the isotropic etching process may be between about 1 minute and 5 minutes.

Figure 18B:
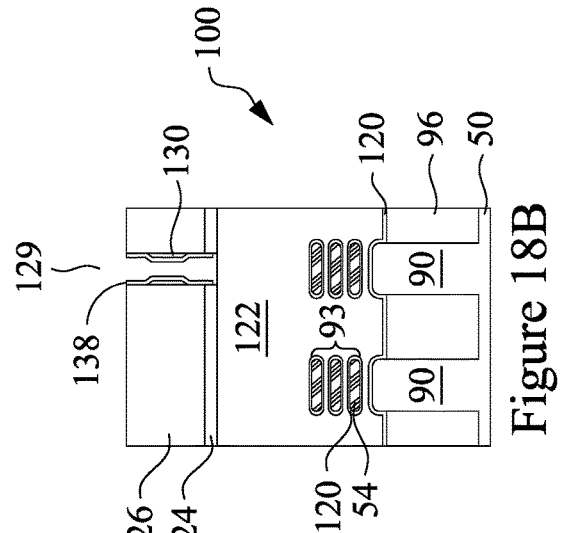
Figure 18A:
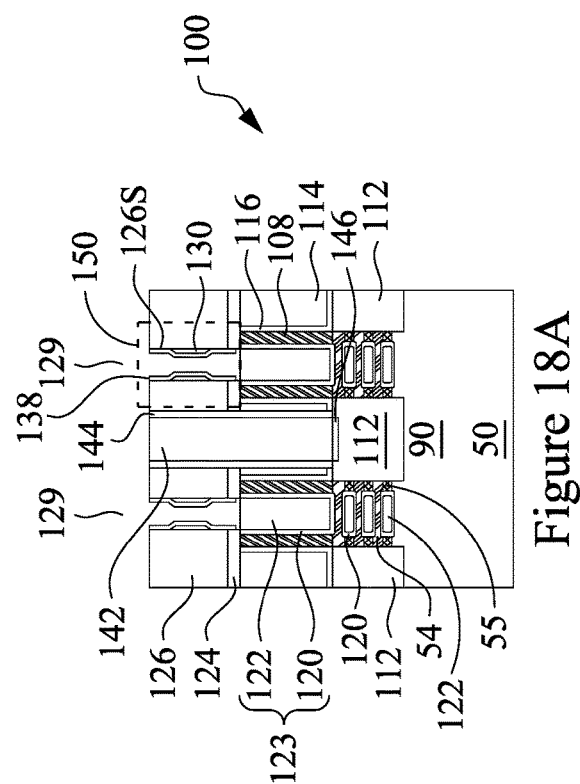
Figure 18D:
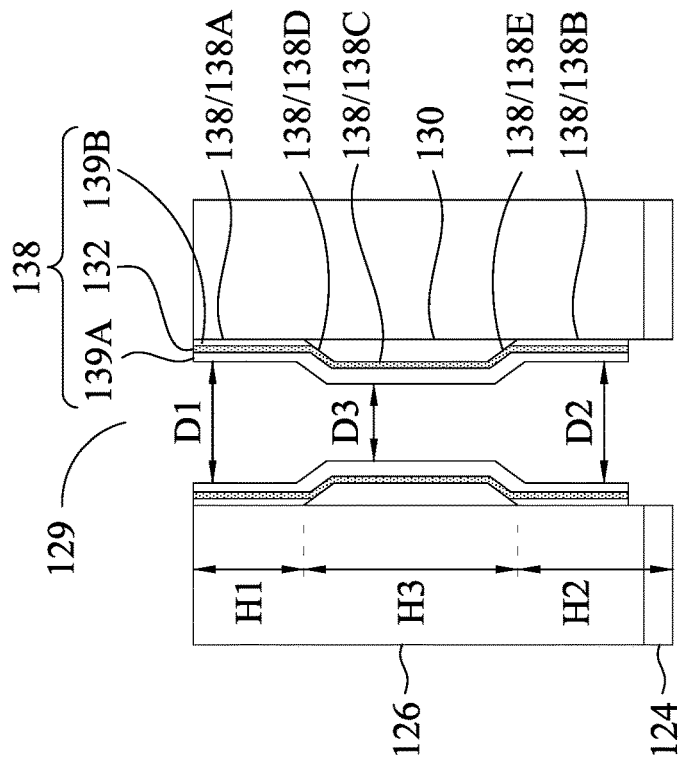
Figure 18C:
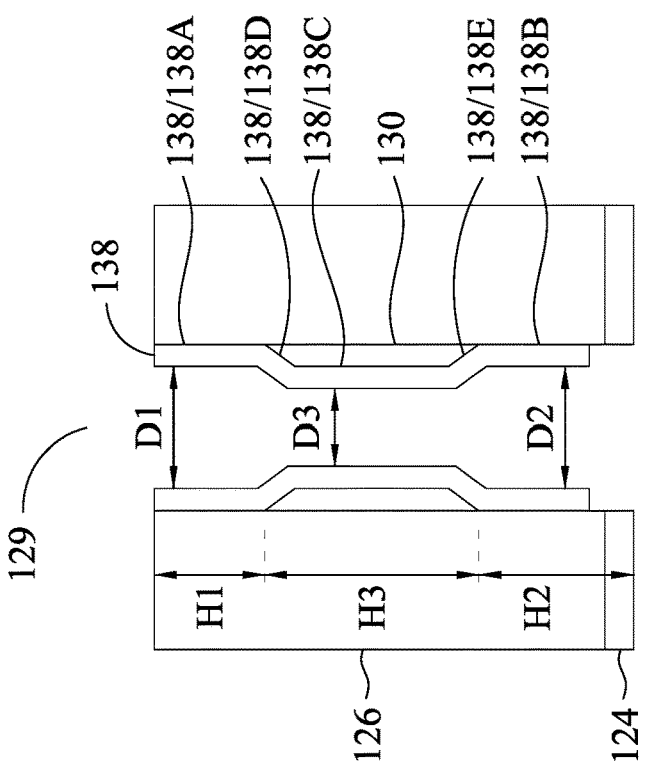

Next, in FIGS. 18A and 18B, an anneal process (also referred to as a thermal anneal process) is performed. In the illustrated embodiment, the remaining portion of the protection layer 132 is oxidized by the anneal process and is converted into a protection layer 138. For example, the material (e.g., silicon, or germanium) of the protection layer 132 reacts with oxygen in the ambient air and forms an oxide (e.g., silicon oxide, or germanium oxide) by the anneal process.

Depending on the condition of the anneal process, such as the temperature and/or the duration of the anneal process, the remaining portion of the protection layer 132 may be completely oxidized into an oxide (see FIG. 18C). Or, the exterior portion (e.g., portions exposed by the openings 129 or the gaps 136) of the remaining portion of the protection layer 132 may be oxidized into an oxide (labeled as 139A or 139B in FIG. 18D), and the interior portion of the remaining portion of the protection layer 132 may remain as the original semiconductor material (labeled as 132 in FIG. 18D).

As illustrated in FIGS. 18A and 18B, after the anneal process, the protection layer 138 contacts and extends along the sidewalls 126S of the second ILD 126 and the remaining portion of the protection layer 130. The gaps 136 in FIGS. 17A and 17B no longer exist. Without being limited to a particular theory, it is believed that during the anneal process, both the second ILD 126 and the protection layer 132 loose water and form O-H bonds in between, which O-H bonds cause the protection layer 132 to bend toward the sidewalls 126S of the second ILD 126, thereby removing the gaps 136. The protection layer 132, or at least the exterior portion thereof, is also oxidized by the anneal process.

FIG. 18C shows a zoomed-in view of an area 150 of the NSFET device 100 in FIG. 18A, in an embodiment. In the example of FIG. 18C, the remaining portion of the protection layer 132 is completely oxidized into an oxide. FIG. 18D shows a zoomed-in view of the area 150 of the NSFET device 100 in FIG. 18A, in another embodiment. In the example of FIG. 18D, the exterior portion of the remaining portion of the protection layer 132 is oxidized into an oxide 139 (labeled as 139A or 139B), and the interior portion of the remaining portion of the protection layer 132 remains as the original semiconductor material (labeled as 132). In other words, the protection layer 138 in FIG. 18C is a single layer of oxide (e.g., silicon oxide, or germanium oxide), while the protection layer 138 in FIG. 18D has sublayers 139A and 139B that are oxide (e.g., silicon oxide, or germanium oxide), and a sublayer 132 that is the semiconductor material 132 (e.g., silicon, or germanium), where the sublayer 132 of semiconductor material is at least partially sandwiched between the sublayers 139A/139B of the oxide.

In FIGS. 18C and 18D, the protection layer 138 has a first segment 138A distal from the gate structure, a second segment 138B proximate to the gate structure, and a third segment 138C between the first segment 138A and the second segment 138B, where the first segment 138A and the second segment 138B contact and extend along the sidewalls 126S of the second ILD 126, and the third segment 138C contacts and extends along the middle sidewall portion of the protection layer 130. The protection layer 138 further includes a fourth segment 138D connecting the first segment 138A and the third segment 138C, and includes a fifth segment 138E connecting the third segment 138C and the second segment 138B. In the example of FIGS. 18A-18D, the first segment 138A, the second segment 138B, and the third segment 138C extend parallel to the sidewalls 126S of the second ILD, while each of the fourth segment 138D and the fifth segment 138E form an acute angle with the sidewalls 126S of the second ILD. FIGS. 18C and 18D further illustrates three different widths, D1, D2, and D3 that correspond to distances between opposing inner sidewalls of the protection layer 138, measured at the first, the second, and the third segments 138A, 138B, and 138C of the protection layer 138, respectively, wherein D1 and D2 are larger than D3. D1 and D3 may be the same in some embodiments, and may be different in other embodiments.

In FIG. 18D, in the first segment 138A and the second segment 138B of the protection layer 138, the sublayer 132 is sandwiched between the sublayers 139A and 139B. In the third, fourth, and fifth segments 138C/138D/138E of the protection layer 138, the sublayer 132 is sandwiched between the sublayer 139A and the remaining portion of the protection layer 130. This may be due to that, during the anneal process, a portion of the remaining portion of the protection layer 132 contacts the remaining portion of the protection layer 130, and therefore, is not exposed to ambient air and thus not oxidized.

Figure 19B:
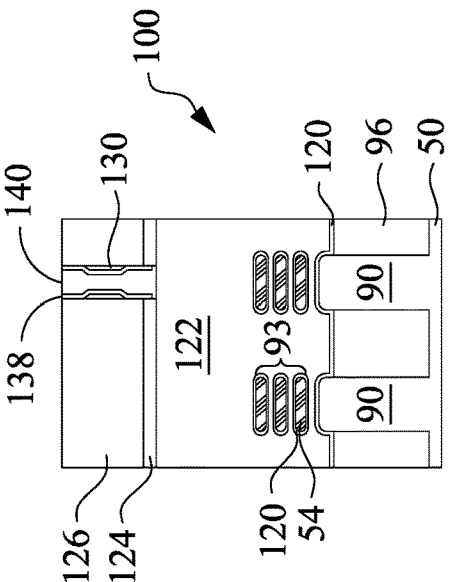
Figure 19A:
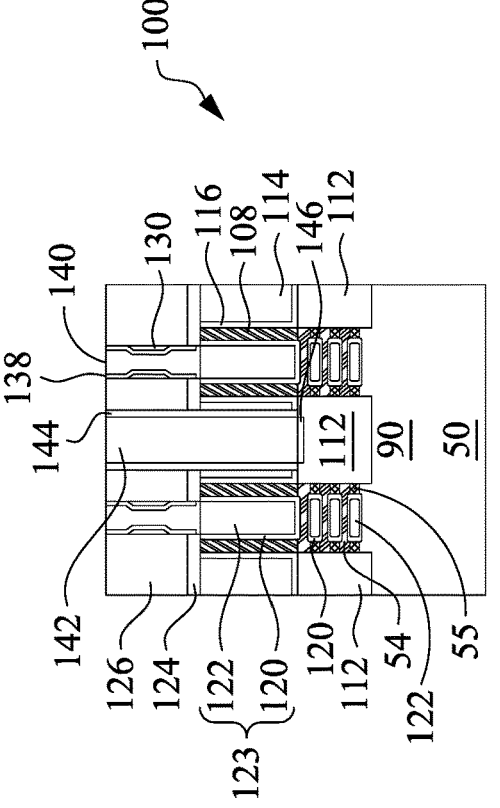
Figure 19D:
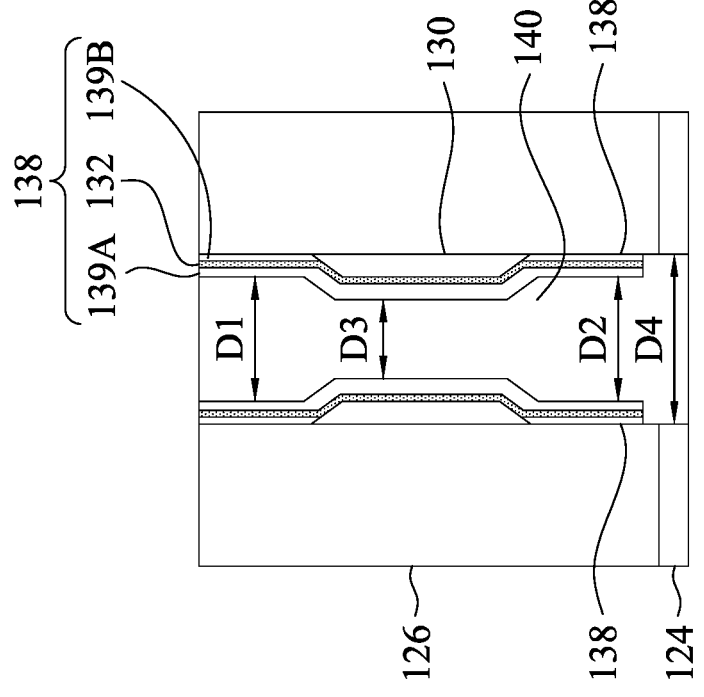
Figure 19C:
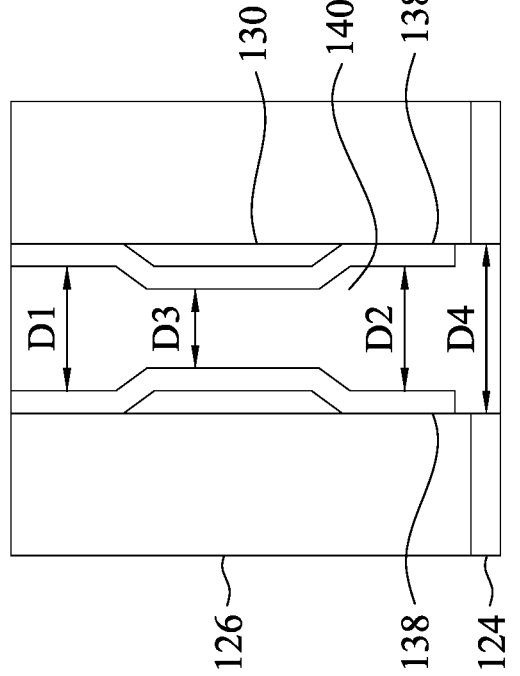

Next, in FIGS. 19A and 19B, an electrically conductive material, such as tungsten, is formed to fill the openings 129, using a suitable formation method, such as PVD, ALD, electroplating, or the like. The electrically conductive material may overfill the openings 129. Next, a planarization process, such as CMP, may be performed to remove excess portions of the electrically conductive material from the upper surface of the second ILD 126, and the remaining portion of the electrically conductive material in the openings 129 form vias 140 (also referred to as contacts 140, or gate contacts 140). Besides tungsten, other electrically conductive material, such as gold, cobalt, the like, or combinations thereof, may also be used to form the gate contacts 140.

FIGS. 19C and 19D show the zoomed-in view of the area 150 in FIG. 18A after the gate contacts 140 are formed, and correspond to the embodiments in FIGS. 18C and 18D, respectively. Note that the gate contacts 140 has a width D1 at an upper end distal from the substrate 50, and has a width D4 at a lower end closest to the substrate 50. In addition, the gate contact 140 has a width D2 at a lower portion of the gate contact 140 adjacent to the lower end of the gate contact, and has a width D3 in a middle portion of the gate contact 140 that is between the upper end and the lower portion of the gate contact 140. In the illustrated embodiment, D4 is larger than D1 and D2. D1 may be the same as D2. D1 and D2 are larger than D3.

In advanced semiconductor manufacturing process, the via contact hole (e.g., 129) definition is very challenge due to the critical dimension requirement. In some embodiments, the ideal profile of the via contact hole should be straight. However, due to process variation of the etching process use to define the via contact hole, and/or due to the material(s) used for, e.g., the second ILD 126 and/or the etch stop layer 124, the via contact hole may not have the ideal profile, and may have a bulging portion extending into the second ILD 126 and/or the etch stop layer 124. Therefore, when the electrically conductive material fills the via contact hole to form the via 140, the via 140 formed may have a bulging portion that extend into the second ILD 126 and/or the etch stop layer 124, this is referred to as a bowing profile for the via 140. The bowing profile may cause electrical short between the via 140 and a laterally adjacent conducive feature (e.g., source/drain vias 143), thus resulting in device failure. The present disclosure, by forming the protection layers 130 and 138 in the via contact holes, forms a strengthening structure around the vias 140 and may prevent the bowing profile from happening, thus reducing device failure and improving production yield. In addition, by having larger widths (e.g., D1, D4, D3) at the upper and lower portions of the via 140, the electrical characteristics (e.g., electrical resistance of the via 140, and/or the average of the dielectric constant k of the strengthening structure) of the device formed are improved.

Additional processing may be performed to finish fabrication of the NSFET device 100, as one of ordinary skill readily appreciates, thus details may not be repeated here. For example, the same or similar process for forming the gate contacts 140 may be used to form source/drain contacts that are electrically coupled to the source/drain regions 112. In addition, interconnect structures that include conductive lines and vias may be formed in the backend-of-the-line (BEOL) processing to interconnect the electrical components formed in/on the substrate 50 to form functional circuits.

Variations of the disclosed embodiments are possible and are fully intended to be included within the scope of the present disclosure. For example, in the illustrated embodiments, the gate contacts 140 are formed before the source/drain contacts. In other embodiments, the source/drain contacts may be formed before the gate contacts 140, or may be formed in the same processing steps for forming the gate contacts 140. As another example, depending on the type of device (e.g., n-type or p-type device) formed, the second semiconductor material 54 may be removed, and the first semiconductor material 52 may remain to form the nanostructures, which nanostructures function as the channel regions of the NSFET device formed. In embodiments where the first semiconductor material 52 remains to form the nanostructures, inner spacers are formed in sidewall recesses in end portions of the second semiconductor material 54 before the second semiconductor material 54 is removed, as one of ordinary skill readily appreciates.

FIGS. 20A and 20B together illustrate a flow chart of a method 1000 of forming a semiconductor device, in accordance with some embodiments. It should be understood that the embodiment method shown in FIGS. 20A and 20B is merely an example of many possible embodiment methods. One of ordinary skill in the art would recognize many variations, alternatives, and modifications. For example, various steps as illustrated in FIGS. 20A and 20B may be added, removed, replaced, rearranged, or repeated.

Referring to FIGS. 20A and 20B, at block 1010, an opening is formed in the dielectric layer to expose a conductive feature underlying the opening. At block 1020, sidewalls and a bottom of the opening are lined with a first protection layer. At block 1030, a second protection layer is formed in the opening over the first protection layer. At block 1040, an anisotropic etching process is performed to remove a first portion of the second protection layer from the bottom of the opening, wherein after the anisotropic etching process, a second portion of the second protection layer remains along the sidewalls of the opening. At block 1050, after the anisotropic etching process, an isotropic etching process is performed to remove, from the sidewalls of the opening, an upper portion of the first protection layer distal from the conductive feature and a lower portion of the first protection layer proximate to the conductive feature, wherein after the isotropic etching process, a middle portion of the first protection layer between the upper portion and the lower portion remains along the sidewalls of the opening. At block 1060, after the isotropic etching process, an anneal process is performed to at least partially convert the second portion of the second protection layer into an oxide. At block 1070, after the anneal process, the opening is filled with an electrically conductive material to form a contact.

Embodiments may achieve advantages. The disclosed method, by forming the strengthening structure (which includes the protection layers 130 and 138) around the vias 140, prevents the bowing profile of the vias 140 from happening, thereby reducing possibility of device failure due to electrical short, and increasing production yield. The shape of the vias are designed to have enlarged upper and lower portions, which improves the electrical characteristics (e.g., lower electrical resistance for the vias 140) of the device formed.

In an embodiment, a method of forming a semiconductor device includes: forming an opening in a dielectric layer to expose a conductive feature underlying the opening; lining sidewalls and a bottom of the opening with a first protection layer; forming a second protection layer in the opening over the first protection layer; performing an anisotropic etching process to remove a first portion of the second protection layer from the bottom of the opening, wherein after the anisotropic etching process, a second portion of the second protection layer remains along the sidewalls of the opening; after the anisotropic etching process, performing an isotropic etching process to remove, from the sidewalls of the opening, an upper portion of the first protection layer distal from the conductive feature and a lower portion of the first protection layer proximate to the conductive feature, wherein after the isotropic etching process, a middle portion of the first protection layer between the upper portion and the lower portion remains along the sidewalls of the opening; after the isotropic etching process, performing an anneal process to at least partially convert the second portion of the second protection layer into an oxide; and after the anneal process, filling the opening with an electrically conductive material to form a contact. In an embodiment, after the isotropic etching process and before the anneal process, the second portion of the second protection layer is spaced apart from the dielectric layer, wherein after the anneal process, the second portion of the second protection layer contacts and extends along the dielectric layer. In an embodiment, the anneal process converts the second portion of the second protection layer into a third protection layer, wherein the third protection layer comprises a first segment distal from the conductive feature, a second segment proximate to the conductive feature, and a third segment between the first segment and the second segment, wherein the first segment and the second segment contact and extend along the dielectric layer, and the third segment contacts and extends along the middle portion of the first protection layer. In an embodiment, the contact has a top portion distal from the conductive feature, a bottom portion proximate to the conductive feature, and a middle portion between the top portion and the bottom portion, wherein the top portion and the bottom portion of the contact are wider than the middle portion of the contact. In an embodiment, the anisotropic etching process is performed using a first etchant selective to the second protection layer, and the isotropic etching process is performed using a second etchant selective to the first protection layer. In an embodiment, the first protection layer is formed of a metallic compound, wherein the second protection layer is formed of a semiconductor material. In an embodiment, the anisotropic etching process is a plasma etching process, and the isotropic etching process is a wet etching process. In an embodiment, the plasma etching process is performed using a hydrofluorocarbon gas. In an embodiment, the wet etching process is performed using an alkaline solution or an acid solution. In an embodiment, the second portion of the second protection layer is completely converted into the oxide of the semiconductor material by the anneal process. In an embodiment, the anneal process converts exterior portions of the semiconductor material into the oxide of the semiconductor material, wherein after the anneal process, an inner portion of the semiconductor material remain unchanged and is interposed between the converted oxide of the semiconductor material.

In an embodiment, a method of forming a semiconductor device includes: forming a dielectric layer over a gate structure, wherein the gate structure is over a fin and between source/drain regions; forming an opening in the dielectric layer, wherein the opening exposes an upper surface of the gate structure and sidewalls of the dielectric layer; conformally forming a first protection layer over an upper surface of the dielectric layer and in the opening; conformally forming a second protection layer over the first protection layer; selectively removing the second protection layer from the upper surface of the dielectric layer and from a bottom of the opening by performing a first etching process, wherein after the first etching process, the second protection layer extends along the sidewalls of the dielectric layer; after the first etching process, selectively removing the first protection layer from the upper surface of the dielectric layer, from the bottom of the opening, and from portions of the sidewalls of the dielectric layer by performing a second etching process, wherein after the second etching process, a remaining portion of the first protection layer extends along the sidewalls of the dielectric layer; after the second etching process, performing an anneal process, wherein the anneal process converts the second protection layer into a third protection layer; and after the anneal process, forming a gate contact by filling the opening with an electrically conductive material. In an embodiment, after the second etching process and before the anneal process, there is a gap between the sidewalls of the dielectric layer and the second protection layer, wherein after the anneal process, the third protection layer contacts and extends along the sidewalls of the dielectric layer. In an embodiment, after the anneal process, the third protection layer further contacts and extends along the remaining portion of the first protection layer. In an embodiment, the second protection layer is formed of a semiconductor material, wherein the anneal process converts the semiconductor material into an oxide of the semiconductor material. In an embodiment, the second protection layer is formed of a semiconductor material, wherein the anneal process converts exterior portions of the second protection layer into an oxide of the semiconductor material, wherein an inner portion of the second protection layer remains as the semiconductor material after the anneal process.

In an embodiment, a semiconductor device includes: a gate structure; source/drain regions on opposing sides of the gate structure; a dielectric layer over the gate structure; and a gate contact in the dielectric layer, wherein the gate contact is over and electrically coupled to the gate structure, wherein an upper portion of the gate contact distal from the gate structure has a first width, a lower portion of the gate contact proximate to the gate structure has a second width, and a middle portion of the gate contact between the upper portion and the lower portion has a third width, wherein the first width and the second width are larger than the third width. In an embodiment, the semiconductor device further comprises: a first protection layer between the gate contact and the dielectric layer; and a second protection layer between the first protection layer and the dielectric layer, wherein the second protection layer contacts and extends along a first segment of sidewalls of the dielectric layer, wherein the first protection layer contacts and extends along a second segment and a third segment of the sidewalls of the dielectric layer, wherein the first segment is between the second segment and the third segment. In an embodiment, the gate contact contacts and extends along a fourth segment of the sidewalls of the dielectric layer. In an embodiment, wherein the first protection layer comprises an oxide of a semiconductor material, and the second protection layer comprises a metallic compound material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming an opening in a dielectric layer to expose a conductive feature underlying the opening;
   lining sidewalls and a bottom of the opening with a first protection layer;
   forming a second protection layer in the opening over the first protection layer;
   performing an anisotropic etching process to remove a first portion of the second protection layer from the bottom of the opening, wherein after the anisotropic etching process, a second portion of the second protection layer remains along the sidewalls of the opening;
   after the anisotropic etching process, performing an isotropic etching process to remove, from the sidewalls of the opening, an upper portion of the first protection layer distal from the conductive feature and a lower portion of the first protection layer proximate to the conductive feature, wherein after the isotropic etching process, a middle portion of the first protection layer between the upper portion and the lower portion remains along the sidewalls of the opening;
   after the isotropic etching process, performing an anneal process to at least partially convert the second portion of the second protection layer into an oxide; and
   after the anneal process, filling the opening with an electrically conductive material to form a contact.

2. The method of claim 1, wherein after the isotropic etching process and before the anneal process, the second portion of the second protection layer is spaced apart from the dielectric layer, wherein after the anneal process, the second portion of the second protection layer contacts and extends along the dielectric layer.

3. The method of claim 1, wherein the anneal process converts the second portion of the second protection layer into a third protection layer, wherein the third protection layer comprises a first segment distal from the conductive feature, a second segment proximate to the conductive feature, and a third segment between the first segment and the second segment, wherein the first segment and the second segment contact and extend along the dielectric layer, and the third segment contacts and extends along the middle portion of the first protection layer.

4. The method of claim 1, wherein the contact has a top portion distal from the conductive feature, a bottom portion proximate to the conductive feature, and a middle portion between the top portion and the bottom portion, wherein the top portion and the bottom portion of the contact are wider than the middle portion of the contact.

5. The method of claim 1, wherein the anisotropic etching process is performed using a first etchant selective to the second protection layer, and the isotropic etching process is performed using a second etchant selective to the first protection layer.

6. The method of claim 1, wherein the first protection layer is formed of a metallic compound, wherein the second protection layer is formed of a semiconductor material.

7. The method of claim 6, wherein the anisotropic etching process is a plasma etching process, and the isotropic etching process is a wet etching process.

8. The method of claim 7, wherein the plasma etching process is performed using a hydrofluorocarbon gas.

9. The method of claim 8, wherein the wet etching process is performed using an alkaline solution or an acid solution.

10. The method of claim 6, wherein the second portion of the second protection layer is completely converted into the oxide of the semiconductor material by the anneal process.

11. The method of claim 6, wherein the anneal process converts exterior portions of the semiconductor material into the oxide of the semiconductor material, wherein after the anneal process, an inner portion of the semiconductor material remains unchanged and is interposed between the converted oxide of the semiconductor material.

12. A method of forming a semiconductor device, the method comprising:

forming a dielectric layer over a gate structure, wherein the gate structure is over a fin and between source/drain regions;

forming an opening in the dielectric layer, wherein the opening exposes an upper surface of the gate structure and sidewalls of the dielectric layer;

conformally forming a first protection layer over an upper surface of the dielectric layer and in the opening;

conformally forming a second protection layer over the first protection layer;

selectively removing the second protection layer from the upper surface of the dielectric layer and from a bottom of the opening by performing a first etching process, wherein after the first etching process, the second protection layer extends along the sidewalls of the dielectric layer;

after the first etching process, selectively removing the first protection layer from the upper surface of the dielectric layer, from the bottom of the opening, and from portions of the sidewalls of the dielectric layer by performing a second etching process, wherein after the second etching process, a remaining portion of the first protection layer extends along the sidewalls of the dielectric layer;

after the second etching process, performing an anneal process, wherein the anneal process converts the second protection layer into a third protection layer; and after the anneal process, forming a gate contact by filling the opening with an electrically conductive material.

13. The method of claim 12, wherein after the second etching process and before the anneal process, there is a gap between the sidewalls of the dielectric layer and the second protection layer, wherein after the anneal process, the third protection layer contacts and extends along the sidewalls of the dielectric layer.

14. The method of claim 13, wherein after the anneal process, the third protection layer further contacts and extends along the remaining portion of the first protection layer.

15. The method of claim 12, wherein the second protection layer is formed of a semiconductor material, wherein the anneal process converts the semiconductor material into an oxide of the semiconductor material.

16. The method of claim 12, wherein the second protection layer is formed of a semiconductor material, wherein the anneal process converts exterior portions of the second protection layer into an oxide of the semiconductor material, wherein an inner portion of the second protection layer remains as the semiconductor material after the anneal process.

17. A method of forming a semiconductor device, the method comprising:

surrounding a gate structure with a first dielectric layer;

forming a second dielectric layer over the gate structure and the first dielectric layer;

forming an opening in the second dielectric layer over the gate structure, wherein the opening exposes an upper surface of the gate structure and sidewalls of the second dielectric layer;

lining sidewalls and a bottom of the opening with a first protection layer;

forming a second protection layer in the opening over the first protection layer, wherein the second protection layer is formed of a different material from the first protection layer;

removing a first portion of the second protection layer from the bottom of the opening, wherein after removing the first portion of the second protection layer, a second portion of the second protection layer remains along the sidewalls of the opening;

after removing the first portion of the second protection layer, removing an upper portion of the first protection layer and a lower portion of the first protection layer from the sidewalls of the opening, wherein the upper portion of the first protection layer is distal from the gate structure, and the lower portion of the first protection layer is proximate to the gate structure, wherein after removing the upper portion and the lower portion of the first protection layer, a middle portion of the first protection layer between the upper portion and the lower portion remains along the sidewalls of the opening;

after removing the upper portion and the lower portion of the first protection layer, performing an anneal process to convert the second portion of the second protection layer into a third protection layer; and after performing the anneal process, filling the opening with an electrically conductive material to form a gate contact.

18. The method of claim 17, wherein removing the first portion of the second protection layer comprises performing an anisotropic etching process to remove the first portion of the second protection layer from the bottom of the opening, wherein removing the upper portion of the first protection layer and the lower portion of the first protection layer comprises performing an isotropic etching process to remove the upper portion of the first protection layer and the lower portion of the first protection layer from the sidewalls of the opening.

19. The method of claim 18, wherein the first protection layer is formed of a metallic compound material, and the second protection layer is formed of a semiconductor material, wherein the third protection layer comprises an oxide of the semiconductor material.

20. The method of claim 19, wherein the anneal process converts exterior portions of the second protection layer into the oxide of the semiconductor material, wherein inner portions of the second protection layer remain as the semiconductor material after the anneal process.

\* \* \* \* \*